(12) United States Patent
Enyama et al.

(10) Patent No.: US 8,907,278 B2
(45) Date of Patent: Dec. 9, 2014

(54) CHARGED PARTICLE BEAM APPLIED APPARATUS, AND IRRADIATION METHOD

(75) Inventors: Momoyo Enyama, Kunitachi (JP); Hiroya Ota, Kokubunji (JP); Taku Ninomiya, Hitachinaka (JP); Mari Nozoe, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/993,822

(22) PCT Filed: Dec. 2, 2011

(86) PCT No.: PCT/JP2011/077900
§ 371 (c)(1),
(2), (4) Date: Jul. 23, 2013

(87) PCT Pub. No.: WO2012/081422
PCT Pub. Date: Jun. 21, 2012

(65) Prior Publication Data
US 2013/0299697 A1 Nov. 14, 2013

(30) Foreign Application Priority Data

Dec. 15, 2010 (JP) ................................ 2010-279166

(51) Int. Cl.
| | | |
|---|---|---|
| G01N 23/00 | (2006.01) | |
| G21K 7/00 | (2006.01) | |
| H01J 37/147 | (2006.01) | |
| H01J 37/12 | (2006.01) | |
| H01J 37/28 | (2006.01) | |
| H01J 37/04 | (2006.01) | |

(52) U.S. Cl.
CPC ..... H01J 37/045 (2013.01); *H01J 2237/24465* (2013.01); H01J 37/147 (2013.01); *H01J 2237/083* (2013.01); *H01J 2237/2817* (2013.01); H01J 37/12 (2013.01); H01J 37/28 (2013.01); *H01J 2237/0835* (2013.01)

USPC ........... 250/307; 250/306; 250/310; 250/311; 250/492.2; 250/396 R; 250/398

(58) Field of Classification Search
USPC .......... 250/306, 307, 310, 311, 492.2, 396 R, 250/398
See application file for complete search history.

(56) References Cited

U.S. PATENT DOCUMENTS

| | | | |
|---|---|---|---|
| 7,244,932 | B2 | 7/2007 | Nakasuji et al. |
| 7,253,417 | B2 | 8/2007 | Frosien et al. |

(Continued)

FOREIGN PATENT DOCUMENTS

| | | | |
|---|---|---|---|
| JP | 2005-251440 A | 9/2005 | |
| JP | 2006-510184 A | 3/2006 | |

(Continued)

*Primary Examiner* — Nikita Wells
*Assistant Examiner* — Meenakshi Sahu
(74) *Attorney, Agent, or Firm* — Mattingly & Malur, PC

(57) ABSTRACT

Provided is a charged particle beam applied apparatus for observing a sample, provided with: a beam-forming section that forms a plurality of charged particle beams on a sample; an energy control unit that controls the incident energy of the plurality of charged particle beams that are irradiated onto the sample; a beam current control unit that controls the beam current of the plurality of charged particle beams that are irradiated onto the sample; and a beam arrangement control unit that controls the arrangement in which the plurality of charged particle beams is irradiated onto the sample. The beam-forming section includes a beam splitting electrode, a lens array upper electrode, a lens array middle electrode, a lens array lower electrode and a movable stage, and functions as the beam current control unit or the beam arrangement control unit through selection, by the movable stage, of a plurality of aperture pattern sets.

12 Claims, 12 Drawing Sheets

(56) References Cited

U.S. PATENT DOCUMENTS

| | | |
|---|---|---|
| 2005/0121611 A1 | 6/2005 | Kimba et al. |
| 2005/0214958 A1 | 9/2005 | Nakasuji et al. |
| 2006/0169910 A1 | 8/2006 | Frosien et al. |
| 2008/0067376 A1 | 3/2008 | Tanimoto et al. |
| 2008/0230697 A1 | 9/2008 | Tanimoto et al. |
| 2009/0001267 A1 | 1/2009 | Enyama et al. |
| 2010/0133433 A1* | 6/2010 | Tanimoto et al. ............ 250/310 |
| 2011/0272576 A1 | 11/2011 | Otaki et al. |

FOREIGN PATENT DOCUMENTS

| | | |
|---|---|---|
| JP | 2007-317467 A | 12/2007 |
| JP | 2008-215969 A | 9/2008 |
| JP | 2009-009882 A | 1/2009 |
| JP | 2009-134926 A | 6/2009 |
| WO | 02/37527 A1 | 5/2002 |
| WO | 02/49065 A1 | 6/2002 |
| WO | 2010/082451 A1 | 7/2010 |

\* cited by examiner

CHARGED PARTICLE BEAM APPLIED APPARATUS, AND IRRADIATION METHOD

TECHNICAL FIELD

The present invention relates to a charged particle beam applied apparatus, and particularly to a highly-sensitive and highly-efficient inspection and measurement technique using charged particle beams.

BACKGROUND ART

In manufacturing processes of semiconductor and magnetic disks, used are a charged particle beam measurement apparatus that irradiates charged particle beams (hereinafter, referred to as primary beams) such as electron beams and ion beams onto a sample, obtains signals of secondary charged particles (hereinafter, referred to as secondary beams) such as generated secondary electrons, and measures the shape and dimensions of a pattern formed on the sample, and a charged particle beam inspection apparatus that checks the presence or absence of defects. As such a conventional charged particle beam applied apparatus, there has been used a so-called SEM (Scanning Electron Microscope)-type apparatus that scans point-like primary beams on a sample. The SEM-type apparatus has characteristics of requiring a long time to obtain an image because the image is obtained by two-dimensionally scanning the primary beams, and the speed of processing a sample, namely, the inspection speed needs to be increased. In order to solve the problem, there has been proposed a multibeam-type charged particle beam applied apparatus in which plural beams are provided, or a multicolumn-type charged particle beam applied apparatus in which plural columns through which beams pass are provided (see Patent Documents 1 to 7). For example, Patent Document 1 discloses a multibeam-type electron beam inspection apparatus in which an electron beam emitted from a single electron gun is split into plural beams, and plural beams formed by being individually focused by array lenses are irradiated and scanned on a sample using a single optical element. In addition, Patent Document 2 discloses a multicolumn-type charged particle beam applied apparatus in which plural immersion lenses obtained by immersing an electric field or a magnetic field into plural apertures are produced and are arranged in the beam travelling direction, so that individual optical systems are arranged for plural beams.

PRIOR ART DOCUMENT

Patent Document

Patent Document 1: Japanese Patent Application Laid-Open No. 2007-317467
Patent Document 2: Japanese Unexamined Patent Application Publication No. 2006-510184
Patent Document 3: Japanese Patent Application Laid-Open No. 2009-009882
Patent Document 4: WO2002/049065
Patent Document 5: Japanese Patent Application Laid-Open No. 2005-251440
Patent Document 6: Japanese Patent Application Laid-Open No. 2008-215969
Patent Document 7: WO2010/082451

SUMMARY OF THE INVENTION

Problem to be Solved by the Invention

The multibeam-type apparatus and the multicolumn-type apparatus are advantageous in that information on a sample can be obtained at the speed several times the SEM-type apparatus by using plural beams. Further, as the number of beams is increased, the inspection speed can be improved.

On the other hand, it is important for the charged particle beam inspection apparatus to control the amount of irradiation current and incident energy in accordance with material and pattern dimensions. For example, for a sample of a thick insulating film, the irradiation current is set at a low level to avoid electrostatic charge on the surface of the sample. For a resist sample, the incident energy is reduced to avoid shrink caused by entering of high-energy electrons. As a method of controlling the amount of irradiation current, a current restricting diaphragm method is generally used in which a diaphragm is provided in an optical system, and combinations of the intensities of lenses provided in front of and behind the diaphragm are changed, so that the density of current passing through the diaphragm is controlled. There is also a method in which voltage applied to a suppressor electrode and an extraction electrode in an electron gun is changed to control emission current. However, this method is not very desirable from the viewpoint of the stability of an electron source. As a method of controlling the incident energy, a retarding method is generally used in which negative (or positive) voltage is applied to a lens tube of a sample to control energy immediately before irradiation. There is also a method of changing the initial accelerating energy of primary beams. However, this method is not desirable because adjustment of the axis needs to be performed every time all optical conditions are changed for each accelerating voltage. Further, if the incident energy is reduced, chromatic aberration becomes large, and an open angle needs to be made smaller from the viewpoint of keeping the resolution. Thus, the open angle, namely, an angle restricting diaphragm needs to be controlled. As a method of controlling the angle restricting diaphragm, there is generally employed a method in which a movable diaphragm having plural apertures with different aperture diameters is mechanically moved to select an aperture. The current is changed by the control, and thus the overall irradiation current is determined by a combination of the restriction by the current restricting diaphragm method and the restriction by the angle restricting diaphragm.

The above-described control is necessary in the multibeam-type apparatus and the multicolumn-type apparatus. In the multicolumn-type apparatus, an optical element is individually arranged for each beam, so that the both can be applied. As described in, for example, Patent Document 2, an individual diaphragm is arranged for each beam on the downstream side of a condenser lens having an individual aperture for each beam, and the excitation of the condenser lens is controlled, so that the beam current can be controlled.

On the contrary, plural beams pass through the same optical element in the multibeam-type apparatus, and thus image rotation and changes of the magnification along with changes of the intensity of a lens and retarding voltage cause fluctuations of the multibeam arrangement, namely, the field of view of each beam. Thus, it is difficult to freely control the irradiation conditions such as the amount of current irradiated onto a sample and the incident energy.

Among the above-described conventional techniques, the amount of irradiation current can be adjusted by the current restricting diaphragm method before the multibeam is formed, as described in, for example, Patent Document 3. Further, as a method of adjusting the amount of irradiation current, Patent Document 4 describes a method of changing the emission of an electron source. However, the fluctuations of the field of view of each beam caused by controlling the irradiation energy and a control method for the open angle are not described in Patent Document 3 and Patent Document 4. Further, Patent Document 5 presents a combination of a retarding method and a current restricting method in a part where the multibeam is formed. However, a beam used when restricting the current is a single beam, and thus it is not related with the object of the present invention.

On the other hand, Patent Document 6 proposes a method in which an electrode with plural apertures is mounted on a stage and is moved, so that a beam suitable for an inspection is selected from the multibeam that can be formed and the rest is blocked. In addition, a method of mounting a part of means to form the multibeam on the stage is suggested. In addition, Patent Document 7 describes that in order to desirably control electrostatic charge, plural aperture sets are provided in a multibeam-forming section to be used in combination with a deflector, so that an aperture group forming the multibeam can be selected in accordance with conditions.

An object of the present invention is to provide a multibeam-type charged particle beam applied apparatus, and an irradiation method therefor in which irradiation conditions such as the amount of current irradiated onto a sample and the incident energy can be freely controlled while applying these techniques.

Means for Solving the Problem

In order to achieve the object, the present invention provides a charged particle beam applied apparatus that observes a sample, the apparatus including: a beam-forming section that forms plural charged particle beams on the sample and includes plural aperture patterns having apertures with intervals that are different from each other; an energy control unit that controls the incident energy of the plural charged particle beams irradiated onto the sample; a beam current control unit that controls the beam current of the plural charged particle beams irradiated onto the sample; and a beam arrangement control unit that controls the arrangement of the plural charged particle beams irradiated onto the sample.

Further, in order to achieve the object, the present invention provides a charged particle beam applied apparatus that observes a sample, the apparatus including: a beam-forming section that forms plural charged particle beams on the sample and includes plural aperture patterns having apertures with intervals that are different from each other; and a control unit that controls the incident energy and the beam current of the plural charged particle beams irradiated onto the sample, and the arrangement irradiated onto the sample.

Furthermore, in order to achieve the object, the present invention provides an irradiation method for charged particle beams of a charged particle beam applied apparatus that observes a sample, wherein: a beam-forming section that forms plural charged particle beams on the sample and includes plural aperture patterns having apertures with intervals that are different from each other, and a control unit that controls the charged particle beam applied apparatus are provided; and the control unit controls the incident energy of the plural charged particle beams irradiated onto the sample, controls the beam current of the plural charged particle beams irradiated onto the sample, and controls the arrangement of the plural charged particle beams irradiated onto the sample.

Specifically, in a preferred aspect of the present invention to achieve the object, provided is a charged particle beam applied apparatus that observes a sample, the apparatus including: a beam-forming section that forms plural charged particle beams on the sample and includes plural aperture patterns having apertures with intervals that are different from each other; an energy control unit that controls the incident energy of the plural charged particle beams irradiated onto the sample; a beam current control unit that controls the beam current of the plural charged particle beams irradiated onto the sample; and a beam arrangement control unit that controls the arrangement of the plural charged particle beams irradiated onto the sample, wherein the energy control unit is a power source for controlling the voltage applied to the sample, the beam current control unit and the beam arrangement control unit are the beam-forming section, the beam-forming section is configured using a beam splitting electrode having the plural aperture patterns, a lens array composed of at least three electrodes having the plural aperture patterns, a movable stage on which the beam splitting electrode and the lens array are mounted, an upstream deflector arranged on the upstream side of the beam splitting electrode, and a downstream deflector arranged on the downstream side of the beam splitting electrode, the plural aperture patterns of the beam splitting electrode are configured using at least two aperture patterns including at least three apertures arranged at the same aperture interval, an interval between an arbitrary first aperture pattern and an arbitrary second aperture pattern included in the plural aperture patterns is twice or longer the aperture interval configuring the first aperture pattern and the aperture interval configuring the second aperture pattern, and any one of: the aperture interval of the first aperture pattern and the aperture interval of the second aperture pattern; an angle formed by a straight line connecting the adjacent apertures in the first aperture pattern and a straight line connecting the first aperture pattern and the second aperture pattern; an angle formed by a straight line connecting the adjacent apertures in the second aperture pattern and a straight line connecting the first aperture pattern and the second aperture pattern; and the aperture diameter of the first aperture pattern and the aperture diameter of the second aperture pattern is different. The plural aperture patterns of the beam-forming section are provided, and an aperture pattern of the beam-forming section that realizes the desired incident energy and beam current is selected, so that the irradiation conditions can be freely controlled.

Effect of the Invention

According to the present invention, it is possible to realize a charged particle beam applied apparatus, or an irradiation method for charged particle beams that can satisfy both of a high defect detection sensitivity and a high inspection speed.

BEST MODE FOR CARRYING OUT THE INVENTION

Figure 1:
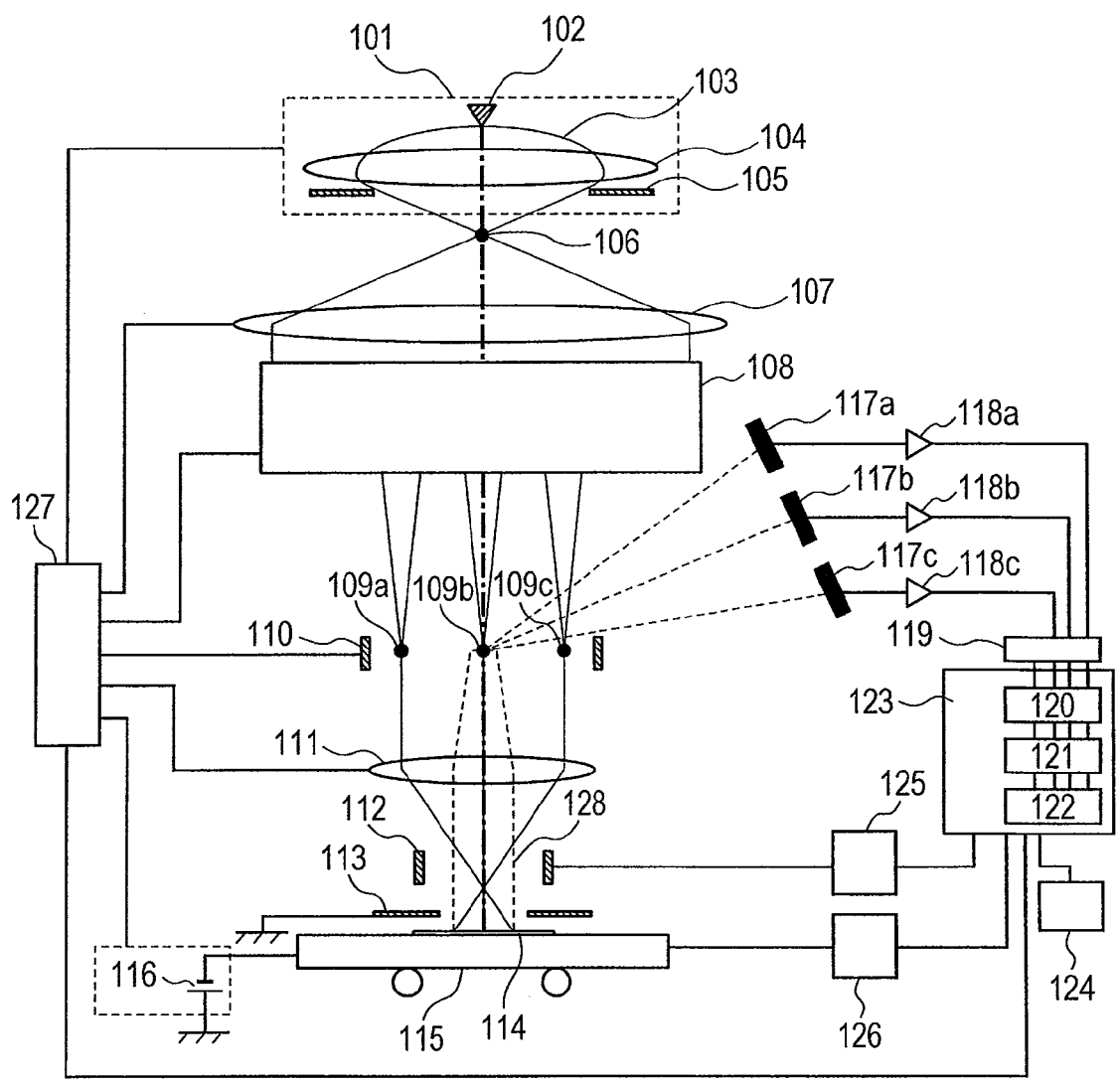
FIG. 1 is a diagram for explaining an outline configuration of an electron beam inspection apparatus according to a first embodiment.

Hereinafter, several embodiments of the present invention will be described in detail on the basis of the drawings. It should be noted that the same reference numerals are given to the same constitutional elements in the all drawings for explaining the embodiments, and the explanations thereof will not be repeated. Hereinafter, embodiments in an observation/inspection apparatus for a sample using electron beams will be shown. However, even in the case where ion beams are used, or even in the case of a measurement apparatus or a general electron microscope, the effect of the present invention is not lost. Further, it should be noted that control means of an optical system or the like for controlling an electron optical system is occasionally referred to as a "control circuit" or a "control unit" in the specification.

First Embodiment

In the embodiment, the basis content of the present invention that is common in the second and subsequent embodiments will be described in advance.

FIG. 1 is a diagram for showing an outline configuration of an electron beam inspection apparatus according to the first embodiment.

First, a configuration of the apparatus will be described. An electron gun 101 includes an electron source 102 composed of substances with a low work function, an anode 105 that is higher in electric potential than the electron source 102, and an electromagnetic lens 104 that superimposes a magnetic field on an accelerating electric field formed between the electron source and the anode. In the embodiment, a Schottky cathode is used because high current can be easily obtained and emission of electrons is stable. In the downstream direction where a primary electron beam 103 is drawn from the electron gun 101, arranged are a lens 107, a beam-forming section 108, a beam separator 110, an objective lens ill, a scanning deflecting deflector 112, a stage 115, secondary beam detectors 117a, 117b, and 117c, and the like. Further, a beam current restricting diaphragm, an aligner for adjusting the central axis (optical axis) of the primary beam, an aberration compensator, and the like are added to the electron optical system (not shown). The stage 115 is moved while a wafer 114 is mounted thereon.

As will be described later, negative electric potential (hereinafter, referred to as retarding electric potential) is applied to the wafer 114. Although not shown in the drawing, a wafer holder is provided between the wafer 114 and the stage 115 while the wafer holder and the wafer are in a conductive state, and predetermined voltage is applied to the wafer holder and the wafer 114 by connecting a retarding power source 116 to the wafer holder.

A ground electrode 113 is installed on the side towards the electron gun from the wafer 114 to restrict a retarding electric field area. A scanning signal generating device 125 is connected to the scanning deflecting deflector 112. An optical system control circuit 127 is connected to each of the electron gun 101, the lens 107, the beam-forming section 108, the beam separator 110, the objective lens 111, and the retarding power source 116, and further a system control unit 123 is connected to the optical system control circuit 127. A stage control device 126 is connected to the stage 115, and further the secondary beam detectors 117a, 117b, and 117c and the scanning deflecting deflector 112 are similarly connected to the system control unit 123.

In the system control unit 123, a storage device 120, an operation unit 121, and a defect determination unit 122 are functionally arranged, and an input/output unit 124 having an image display device is connected thereto. Further, although not shown in the drawing, it is obvious that constitutional elements other than the control system and the circuit system are arranged in a vacuum case, and are operated by evacuation. In addition, it is obvious that a wafer delivery system by which the wafer is arranged on the stage from the outside of the vacuum is provided.

Specifically, it should be noted that the system control unit 123 includes a central processing unit that is the operation unit 121 and a storage unit that is the storage device 120, and a program or the like stored in the storage device 120 is executed by using the central processing unit as the operation unit 121, so that the function of the defect determination unit 122 or the control functions of the scanning signal generating device 125, the stage control device 126, the optical system control circuit 127, and the like can be performed. In the specification, the system control unit, the system control unit and the input/output unit 124, and further the scanning signal generating device 125, the stage control device 126, the optical system control circuit 127, and the like controlled by the system control unit are collectively referred to as a control unit in some cases. Further, the input/output unit 124 may be configured in such a manner that input means such as a keyboard and a mouse and display means such as a liquid crystal device are separately configured as an input unit and an output unit, respectively. Alternatively, the input/output unit 124 may be configured using integrated input/output means using a touch panel or the like.

Next, a wafer pattern inspection in the apparatus of the embodiment will be described. The primary beam 103 emitted from the electron source 102 is accelerated in the direction of the anode 105 while being focused by the electromagnetic lens 104 to form a first electron source image 106 (a point where the diameter of the beam is minimized). Although not shown in the drawing, a diaphragm is arranged at the electron gun 101, so that an electron beam in a desired current range passes through the diaphragm. If the operation conditions of the anode 105 and the electromagnetic lens 104 are changed, the amount of current of the primary beam passing through the diaphragm can be adjusted to the desired amount of current. Further, although not shown in the drawing, an aligner is arranged between the electron gun 101 and the lens 107 to correct the optical axis of the primary electron beam, so that the optical axis can be corrected in the case where the central axis of the electron beam is shifted relative to the diaphragm and the electron optical system. The lens 107 adjusts the primary beams substantially parallel to each other by using the first electron source image 106 as a light source.

In the embodiment, the lens 107 is an electromagnetic lens, and is electrically controlled by the optical system control circuit 127 having received a command from the system control unit 123. The primary beam 103 enters the beam-forming section 108, and is individually focused to form plural beams. In the configuration of the apparatus of FIG. 1, exemplified is a case in which the number of beams is three, and plural second electron source images 109a, 109b, and 109c are formed.

The primary beams 103 individually focused by the beam-forming section 108 pass through the beam separator 110. The beam separator 110 is used to separate the primary beams 103 and secondary beams 128 from each other. The embodiment employs a Wien filter that generates a magnetic field and an electric field that are orthogonal to each other in a plane that is substantially vertical to the incident direction of the primary beams and provides a deflection angle to the electrons passing therethrough in accordance with the energy. In the embodiment, the intensities of the magnetic field and the electric field are set, so that the primary beams are directed straight. Further, the intensity of the electromagnetic field is adjusted and controlled, so that the secondary electron beam entering from the opposite direction is deflected by a desired angle. The objective lens 111 is an electromagnetic lens to project the second electron source images 109a, 109b, and 109c onto the surface of the wafer 114 as a sample while reducing the sizes thereof.

The scanning deflecting deflector 112 is installed in the objective lens 111. When a signal is input to the deflector 112 by the scanning signal generating device 125, three primary beams passing through the deflector 112 are deflected in substantially the same direction by substantially the same angle to perform raster scanning on the surface of the wafer 114 as a sample. The system control unit 123 uniformly controls the scanning signal generating device 125 and the stage control device 126 to inspect a predetermined area of the surface of the wafer 114, and is calibrated in advance.

Figure 2:
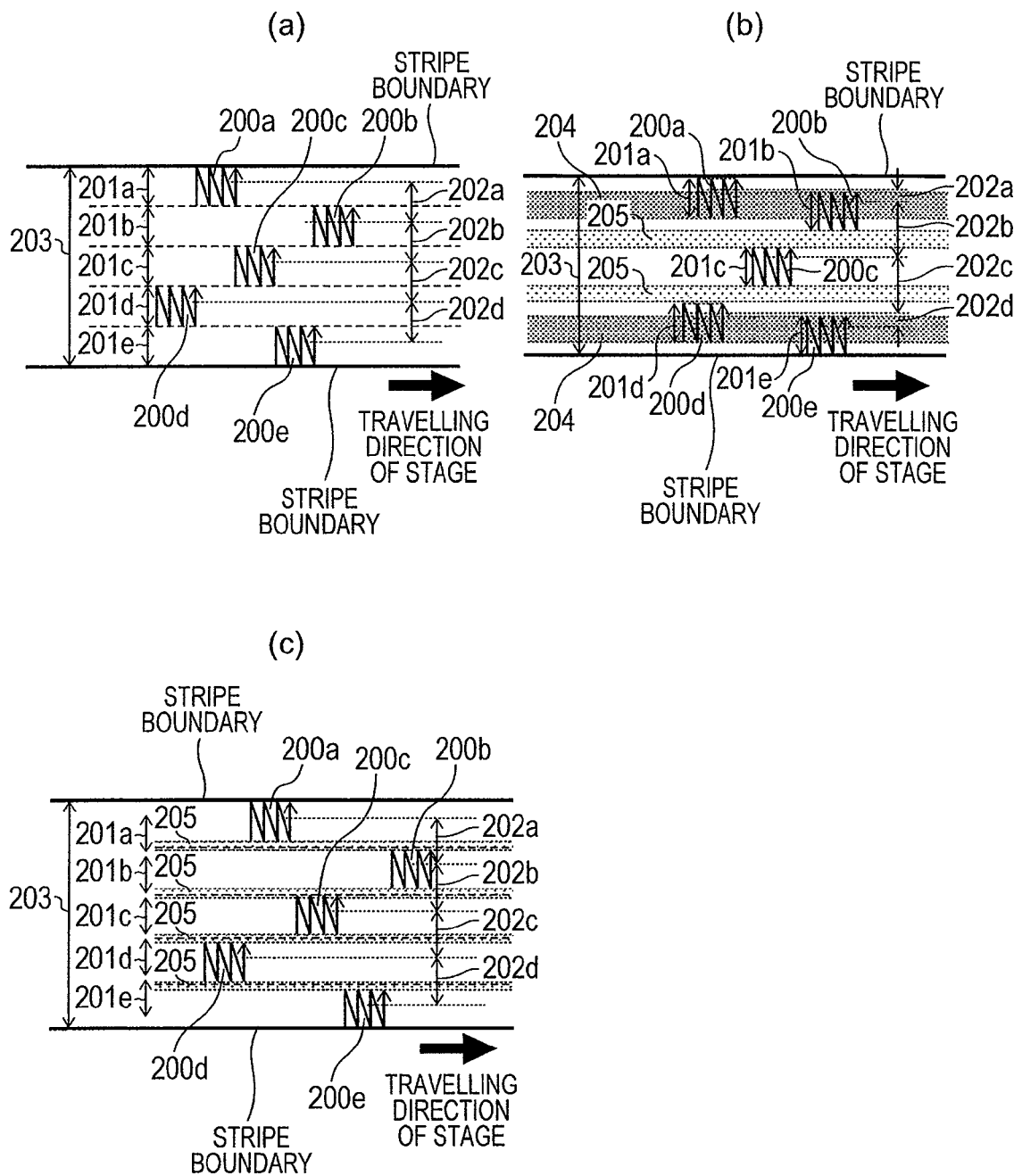
FIG. 2 is a diagram for explaining an outline of raster scanning of an ideal case of multibeam arrangement and a case in which the multibeam is deviated from the ideal arrangement.

An outline of ideal raster scanning in the multibeam will be described using FIG. 2(a). In FIG. 2, the number of beams is five. However, the same explanation can be made irrespective of the number of beams. FIG. 2(a) is a diagram for explaining the raster scanning in the case where the primary beams are ideally arranged when the primary beams reach the surface of the sample. The trajectories of five primary beams 200a, 200b, 200c, 200d, and 200e on the sample are shown by arrows. Primary beam intervals 202a, 202b, 202c, and 202d are the same when the positions of the five primary beams 200a to 200e are projected in the direction orthogonal to the travelling direction of the stage at arbitrary times. The scanning deflecting deflector 112 allows the primary beams 200a, 200b, 200c, 200d, and 200e to perform the raster scanning on the wafer 114 as a sample with deflection widths 201a, 201b, 201c, 201d, and 201e, respectively. In this case, the deflection widths 201a to 201e are the same, and equal to the beam intervals 202a to 202d. At the same time, the stage 115 is continuously moved in the travelling direction of the stage shown by an arrow in the drawing, and a width of field of view 203 five times each of the beam intervals 202a to 202d or each of the deflection widths 201a to 201e is thoroughly scanned by the five primary beams. In addition, each of ranges through which plural band-like areas corresponding to the respective beams pass, namely, each of stripes arranged in the travelling direction of the stage is inspected. It should be noted that the raster scanning can be thoroughly performed on the sample using the plural primary beams irrespective of the number of beams.

Retarding electric potential is applied to the wafer 114 by the retarding power source 116, and a retarding electric field that decelerates the primary beams is formed near the surface of the wafer 114. The retarding power source 116 is uniformly controlled by the system control unit 123 through the optical system control circuit 127 as similar to the other optical elements, namely, the electron gun 101, the lens 107, the beam-forming section 108, the beam separator 110, and the objective lens 111.

Three primary beams having reached the surface of the wafer 114 interact with substances around the surface. Accordingly, fringe electrons such as reflection electrons, secondary electrons, and Auger electrons are generated from the sample to become the secondary beams 128.

The secondary beams 128 are focused by the objective lens 111. In addition, the secondary beams are separated from the orbits of the primary beams by the beam separator 110 having a deflection effect. In order to obtain signals of the multibeam without being mixed, the secondary electron beams 128 separately reach the plural secondary beam detectors 117a, 117b, and 117c corresponding to the respective beams without being mixed. The detected signals are amplified by amplifying circuits 118a, 118b, and 118c to be digitalized by an A/D converter 119, and the digitalized signals are once stored in the storage device 120 of the system control unit 123 as image data. Thereafter, the operation unit 121 calculates various statistics of the image, and finally determines the presence or absence of defects on the basis of defect determination conditions obtained by the defect determination unit 122 in advance. These can be realized by program processing of the above-described central processing unit. The determination result is displayed on the image display device of the input/output unit 124. With the above-described procedures, the pattern inspection can be sequentially performed from an end of an area to be inspected on the wafer 114.

Next, a method of controlling the incident energy and irradiation current of charged particle beams and multibeam arrangement using an energy control unit, a beam current control unit, and a beam arrangement control unit in the embodiment will be described. As described above, the retarding electric potential is applied to the wafer 114 by the retarding power source 116, and the primary beams enter the wafer 114 after being decelerated from the accelerated electric potential by the retarding voltage. The incident energy can be controlled by controlling the retarding voltage. Specifically, the retarding power source that can control voltage functions as an energy control unit. The fluctuations of the retarding voltage cause a focus shift, and the focus shift needs to be corrected by adjusting the intensity of the lens after the beam-forming section 108 forming the multibeam. In the embodiment, the lens after the beam-forming section 108 is the objective lens 111, and the focus shift is corrected by adjusting the intensity of the objective lens 111. Here, the amount of rotation of the image and the magnification are changed by adjusting the intensity of the objective lens 111, and the multibeam arrangement, namely, the field of view of each beam is changed. This state will be further explained using FIG. 2.

For simplification, the number of beams is five in FIG. 2. However, the same explanation can be made irrespective of the number of beams. Regarding the ideal case shown in FIG. 2(a), refer to the above description. If the primary beams are deviated from the ideal arrangement on the surface of the sample, it is impossible to perform the seamless raster scanning without overlaps as shown in FIG. 2(a). Examples of arrangement shifts of the primary beams are shown in FIGS. 2(b) and 2(c).

FIG. 2(b) shows a case in which the primary beams are rotated from the ideal arrangement by changing the intensity of the objective lens 111. The primary beam intervals 202a to 202d obtained when the positions of the five primary beams 200a to 200e are projected in the direction vertical to the travelling direction of the stage are not the same unlike the case shown in FIG. 2(a). If the deflection widths 201a to 201e and the deflection direction (direction vertical to the travelling direction of the stage) are the same as those of FIG. 2(a), areas 204 where the primary beams are irradiated doubly and areas 205 where no primary beams are irradiated are generated. Further, the width of field of view 203 becomes narrower than that of FIG. 2(a). If the deflection widths 201a to 201e become wider than those of FIG. 2(a), the areas 205 where no primary beams are irradiated are eliminated. However, the areas 204 where the primary beams are irradiated doubly are increased. On the contrary, if the deflection widths 201a to 201e become narrower than those of FIG. 2(a), the areas 204 where the primary beams are irradiated doubly are eliminated. However, the areas 205 where no primary beams are irradiated are increased.

FIG. 2(c) shows a case in which the magnification is increased by changing the intensity of the objective lens 111 and the primary beams become wider than the ideal arrangement on the surface of the sample. If it is assumed that the deflection widths 201a to 201e and the deflection direction (direction vertical to the travelling direction of the stage) are the same as those of FIG. 2(a), the width of field of view 203 becomes wider than that of FIG. 2(a). However, the areas 205 where no primary beams are irradiated are generated. If the deflection widths 201a to 201e become wider than those of FIG. 2(a), the areas 205 where no primary beams are irradiated are eliminated, and a seamless inspection can be performed. However, desired resolution cannot be possibly obtained because the beam diameter cannot be sufficiently squeezed due to a high magnification of the total primary optical system, or defection aberration is increased by an increase of the deflection widths 201a to 201e. On the contrary, in the case where the primary beams become narrower than the ideal arrangement on the surface of the sample, although not shown in the drawing, the areas where the primary beams are irradiated doubly are increased. If the deflection widths become narrower, a seamless inspection can be performed. However, the width of the field of view disadvantageously becomes narrower.

Accordingly, in order to correct the shift from the ideal beam arrangement along with the control of the incident energy, the intensity, the amount of rotation, and the magnification of the objective lens 111 relative to the irradiation energy are obtained in advance, and the beam arrangement in the beam-forming section 108 is changed in accordance with the irradiation energy, so that the beam arrangement on the surface of the wafer 114 becomes the same even when any irradiation energy is selected. In this case, the amount of current of the multibeam formed in the beam-forming section 108 is simultaneously changed, so that the irradiation current can be controlled. Accordingly, the incident energy, the irradiation current, and the multibeam arrangement can be controlled. Specifically, the beam-forming section 108 functions as the beam current control unit and the beam arrangement control unit in the embodiment.

Second to fourth embodiments show concrete examples related to control means for controlling the beam arrangement and the irradiation current in the beam-forming section 108 and procedures of observing the sample in the first embodiment. In the following embodiments, the beam-forming section 108 will be described in detail. Regarding the other basic device configurations, refer to the first embodiment.

Second Embodiment

The second embodiment relates to an electron beam inspection apparatus having the basis configuration described in detail in the first embodiment, and particularly having a more concrete embodiment of the beam-forming section 108.

Figure 3A:
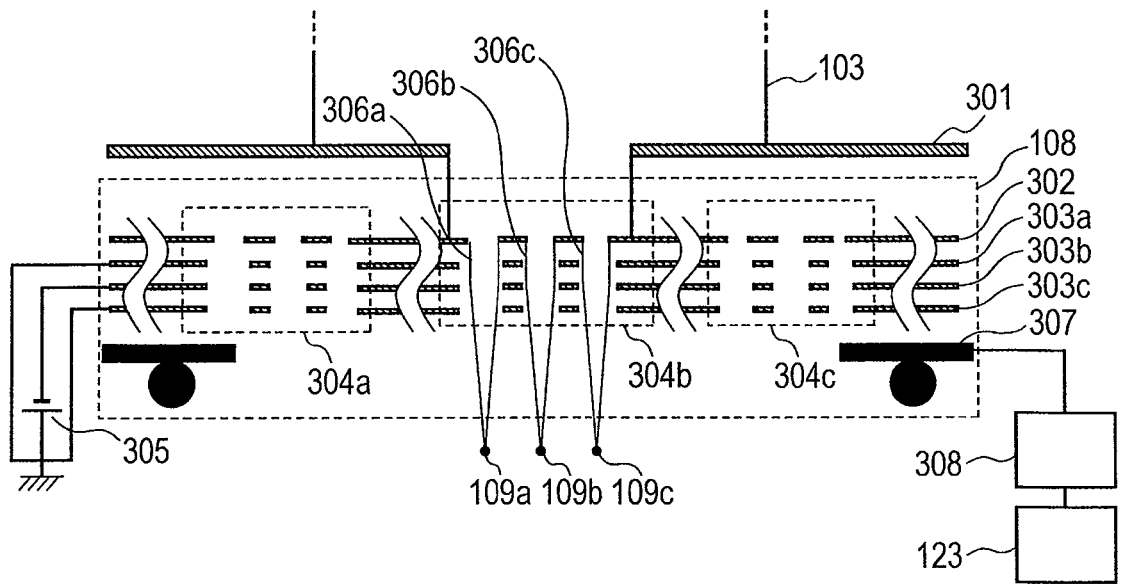
FIG. 3A is a schematic view of a beam-forming section in an electron beam inspection apparatus according to a second embodiment.
Figure 3B:
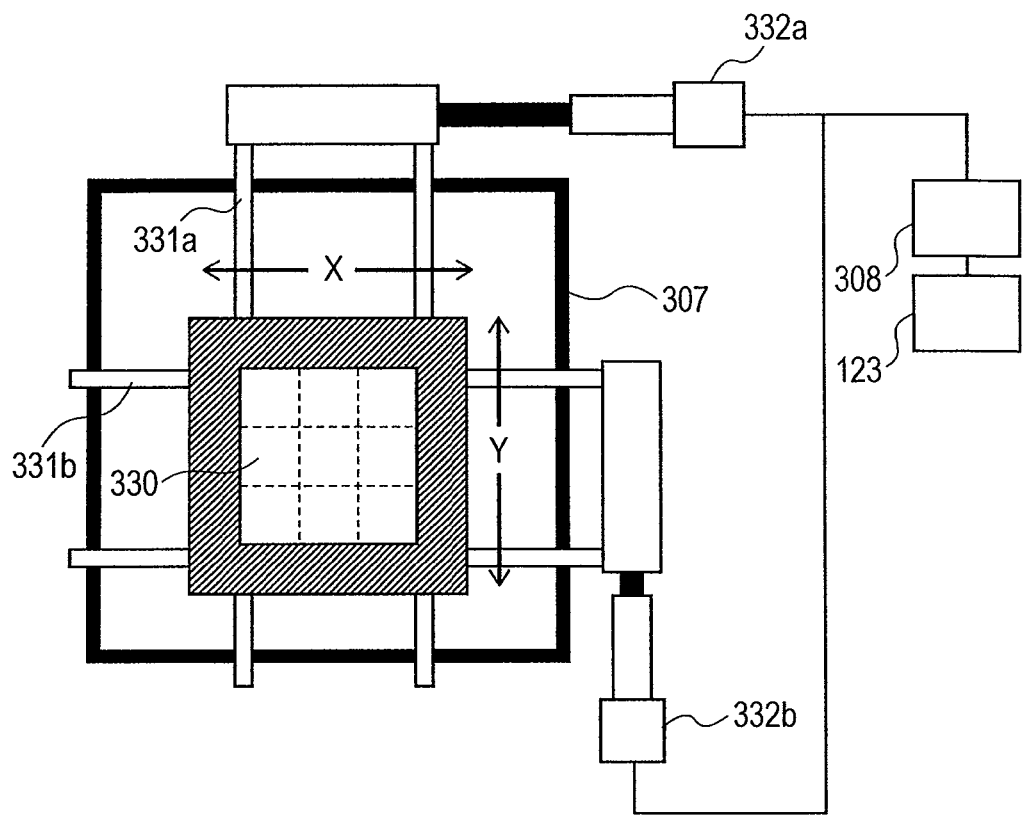
FIG. 3B is a schematic view of the beam-forming section in the electron beam inspection apparatus according to the second embodiment when viewed from the upper side.

FIG. 3A and FIG. 3B are schematic views of the beam-forming section 108 in the electron beam inspection apparatus according to the second embodiment when viewed from the lateral side and the upper side, respectively. In the embodiment, the beam-forming section 108 is configured using a beam splitting electrode 302, a lens array upper electrode 303a, a lens array middle electrode 303b, a lens array lower electrode 303c, and a movable stage 307, and a diaphragm 301 is arranged on the upstream side of the beam-forming section 108. The beam splitting electrode 302, the aperture lens array upper electrode 303a, the lens array middle electrode 303b, and the lens array lower electrode 303c are electrodes having plural apertures at positions corresponding to each other. The movable stage 307 is connected to the system control unit 123 through a stage control device 308, and is controlled by the system control unit 123.

A method of forming the multibeam from the primary beams 103 in the beam-forming section 108 of the embodiment will be described. When the primary beams 103 reach the beam splitting electrode 302, electrons having reached portions other than the aperture portions of the beam splitting electrode 302 are blocked. Only electrons having reached the aperture portions pass through the downstream side of the beam splitting electrode 302, and are split into plural split primary beams 306a, 306b, and 306c to reach the lens array upper electrode 303a. When voltage is applied to each of the lens array upper electrode 303a, the lens array middle electrode 303b, and the lens array lower electrode 303c, an electric field seeps from the aperture portions of each electrode. Thus, the aperture portions function as electrostatic lenses. The respective apertures of the three electrodes correspond to those of the beam splitting electrode 302. Thus, each of the apertures functions as an individual lens for each beam. In the embodiment, the lens array upper electrode 303a and the lens array lower electrode 303c are grounded, and an einzel lens that supplies and applies negative voltage from a lens power source 305 to the lens array middle electrode 303b was employed. Accordingly, the primary beams 103 pass through the beam splitting electrode 302, the lens array upper electrode 303a, the lens array middle electrode 303b, and the lens array lower electrode 303c to become the multibeam, and the second electron source images 109a to 109c are formed.

In this case, as described in the first embodiment, the magnification of the optical system, namely, the intervals of the beams and the amount of rotation of the multibeam arrangement are changed along with changes of the optical system relative to the incident energy to the sample. On the other hand, the formed multibeam arrangement is dependent on the aperture patterns of the beam splitting electrode 302, the lens array upper electrode 303a, the lens array middle electrode 303b, and the lens array lower electrode 303c. Further, the irradiation current is determined on the basis of the amount of current passing through the apertures of the beam splitting electrode 302, namely, the aperture diameters of the beam splitting electrode 302. Accordingly, if plural aperture patterns are prepared for each electrode and the aperture pattern to be used is switched, the multibeam arrangement can be changed. In the embodiment, nine types of aperture patterns are prepared for each electrode, and three types of aperture pattern sets 304a, 304b, and 304c are shown in FIGS. 3A and 3B. It should be noted that the corresponding aperture patterns of the beam splitting electrode 302, the lens array upper electrode 303a, the lens array middle electrode 303b, and the lens array lower electrode 303c as shown in FIG. 3A are collectively referred to as the aperture pattern set.

FIGS. 3A and 3B show an example in which the aperture pattern set 304b is selected, but the aperture pattern sets 304a and 304c are not selected. The beam splitting electrode 302, the lens array upper electrode 303a, the lens array middle electrode 303b, and the lens array lower electrode 303c are mounted on the movable stage 307. Accordingly, if the aperture pattern set is switched to another, it is only necessary to control the movable stage 307 to be moved to a position where a desired aperture pattern set is selected by the diaphragm 301. In the embodiment, the movable stage 307 is controlled by the stage control unit 308 that functions as a part of the beam current control unit and the beam arrangement control unit.

The irradiation of the primary beams 103 onto an aperture pattern set other than the selected one is not desirable because the electron beams are irradiated onto an area on the sample where the electron beams are not supposed to be irradiated. Accordingly, the diaphragm 301 is arranged on the upstream side of the beam-forming section 108 in the embodiment, and the primary beams 103 are irradiated onto only the aperture pattern set 304b. It should be noted that the diaphragm 301 is arranged immediately above the beam-forming section in the embodiment. However, if the conditions of restricting an irradiation area on the sample can be set, the diaphragm 301 may be arranged at a different position. Further, the intervals of the respective aperture pattern sets can be set twice or larger the aperture intervals in the aperture patterns in the embodiment, so that it is difficult to irradiate the primary beams 103 onto the apertures of the adjacent aperture pattern set.

FIG. 3B is a diagram of the beam-forming section 108 when viewed from the upper side. XY movable mechanisms, namely, X-direction rails 331a and Y-direction rails 331b are installed at the stage 307, and electrodes 330 (the beam splitting electrode 302, the lens array upper electrode 303a, the lens array middle electrode 303b, and the lens array lower electrode 303c in FIG. 3A) are mounted at the intersecting points. There is an opened space between the rails, so that the electron beams can pass through the electrodes 330. The X-direction rails 331a are driven by an X-direction motor 332a, and the Y-direction rails 331b are driven by a Y-direction motor 332b. The X-direction motor 332a and the Y-direction motor 332b are connected to the stage control device 308, and can move the electrodes 330 to a desired position with a signal transmitted by the stage control device 308. It should be noted that as illustrated in FIG. 3A, when the electron beams are allowed to pass through, voltage is applied to the lens middle electrode 303b from the lens power source 305. However, when the stage is moved, the voltage is desirably turned off.

Figure 4:
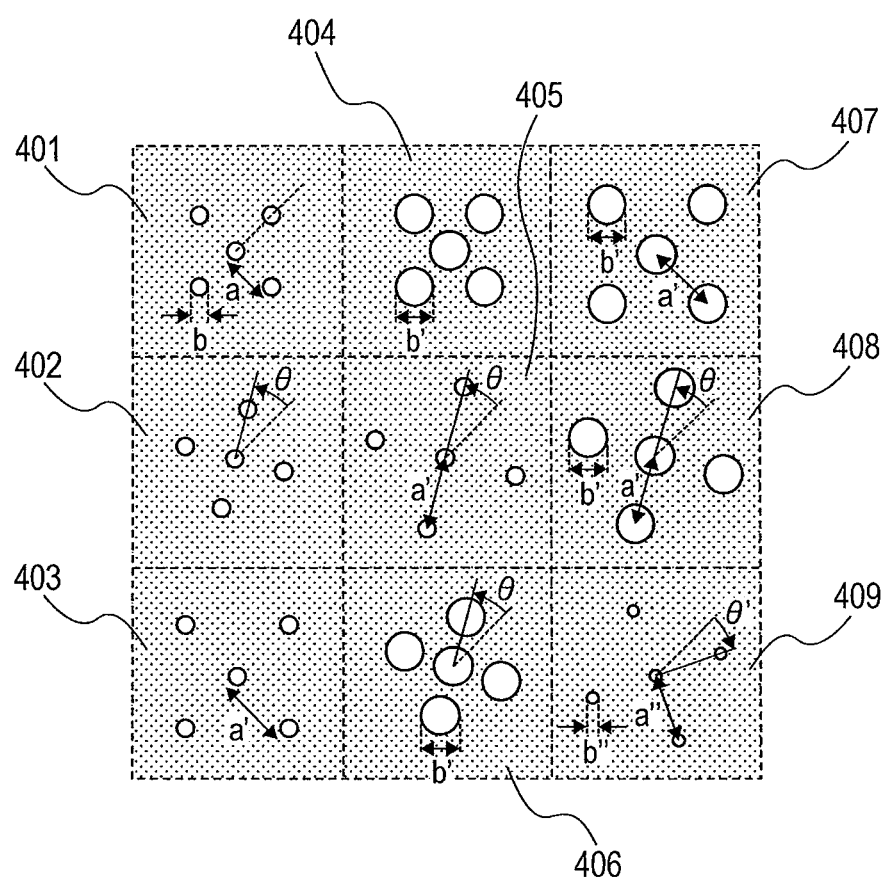
FIG. 4 is a schematic view of a beam splitting electrode according to the second embodiment.

Next, the aperture pattern sets will be described using FIG. 4. FIG. 4 shows a plan view of a beam splitting electrode that is used in the embodiment, has apertures with intervals that are different from each other, and includes plural aperture patterns. FIG. 4 is a schematic view of the beam splitting electrode 302 when viewed from the upper side of FIGS. 3A and 3B. It should be noted that although not shown in the drawing, the aperture patterns of the lens array upper electrode 303a, the lens array middle electrode 303b, and the lens array lower electrode 303c are the same in the embodiment, and each aperture pattern is arranged while being associated with the aperture pattern of the beam splitting electrode 302. Further, the aperture diameters of the lens array upper electrode 303a, the lens array middle electrode 303b, and the lens array lower electrode 303c are the same in any patterns, and are 1.1 times or larger the aperture diameter of the beam splitting electrode 302. However, even in the case where the aperture diameter and the aperture shape are different from the above, the effect of the present invention is not lost. Further, nine types of aperture pattern sets are provided in the embodiment. However, the effect is not lost irrespective of the number of aperture pattern sets.

Aperture patterns 402 to 409 in the drawing are arrangements of representative nine types of aperture patterns on the beam splitting electrode having apertures with intervals that are different from each other to change the multibeam arrangement by using an aperture pattern 401 as a reference. It should be noted that the number of apertures of each of the aperture patterns is five in the embodiment, and the primary beam is split into five.

The aperture pattern 402 is obtained by rotating the arrangement of the aperture pattern 401 only by an angle θ, and changes of the amount of rotation of the multibeam along with changes of the optical system are corrected by the rotation of the pattern arrangement. The aperture pattern 403 is an aperture pattern in which each interval of the apertures is changed to a' whereas each interval of the apertures of the aperture pattern 401 is a, and changes of the beam interval of the multibeam along with changes of the magnification of the optical system are corrected using changes of the pattern interval. The aperture pattern 404 is an aperture pattern in which each diameter of the apertures is changed to b' whereas each diameter of the apertures of the aperture pattern 401 is b, and the amount of current of the primary beams 103 passing through the beam splitting electrode 302 is set at the square of (b'/b).

The aperture pattern 405 is obtained by combining the correction of the rotation with that of the magnification, the pattern arrangement is rotated only by the angle θ relative to the aperture pattern 401, and further each interval of the apertures is changed to a'. The aperture pattern 406 is obtained by combining the correction of the rotation with an increase in the amount of current, the pattern arrangement is rotated only by the angle θ relative to the aperture pattern 401, and further each diameter of the apertures is changed to b. The aperture pattern 407 is obtained by combining the correction of the magnification with an increase in the amount of current, each interval of the apertures is changed to a' relative to the aperture pattern 401, and further each diameter of the apertures is changed to b.

The aperture patterns 408 and 409 are obtained by combining the correction of the rotation and the magnification and changes in the amount of current with each other. The aperture pattern 408 is an aperture pattern in which the pattern arrangement is rotated only by the angle θ relative to the aperture pattern 401, each interval of the apertures is changed to a', and further each diameter of the apertures is changed to b. The aperture pattern 409 is an aperture pattern in which the pattern arrangement is rotated only by an angle θ' relative to the aperture pattern 401, each interval of the apertures is changed to a", and further each diameter of the apertures is changed to b".

As described above, the rotation of the multibeam arrangement, changes of the magnification, and current values can be controlled by selecting the plural aperture patterns having apertures with intervals that are different from each other by using the beam current control unit and the beam arrangement control unit configured using the beam-forming section 108, the stage control unit 308, the system control unit 123, the optical system control circuit 127 and the like in the embodiment. It should be noted that the amount of rotation, changes of the magnification, and the aperture diameter are shown using the examples of the configurations of representative nine types of aperture patterns in the embodiment. However, even in the case of other examples, the effect is not lost. As described above, the intervals of the respective aperture pattern sets can be set twice or larger the aperture intervals in the aperture patterns, so that it is difficult to irradiate the primary beams 103 onto the apertures of the adjacent aperture pattern set. More specifically, the interval between an arbitrary first aperture pattern (for example, the aperture pattern 401) and an arbitrary second aperture pattern (for example, the aperture pattern 404) included in the plural aperture patterns 401 to 409 is set twice or larger each interval of the apertures configuring the first aperture pattern and the second aperture pattern.

Figure 11:
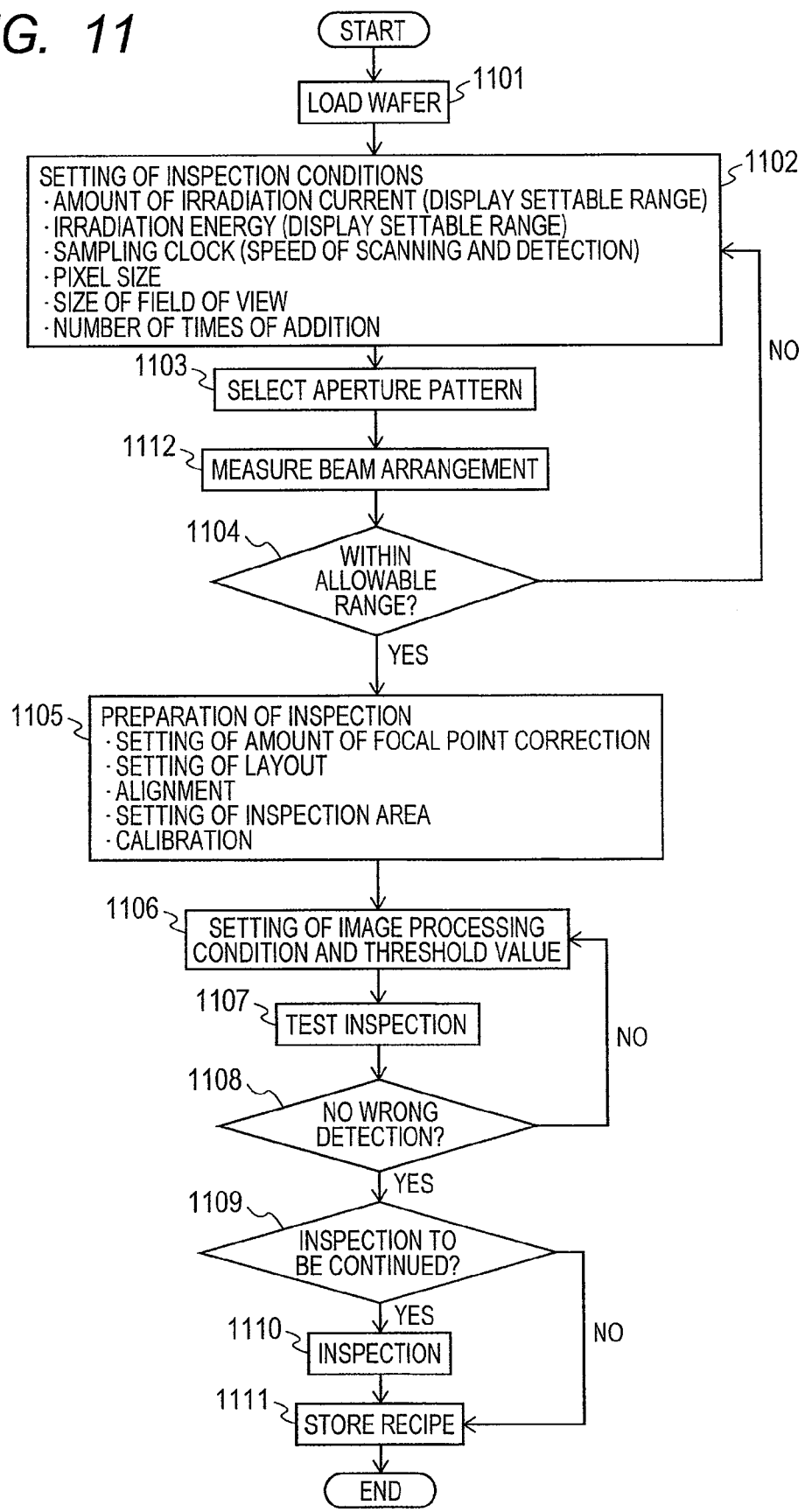
FIG. 11 is a diagram for showing a flowchart from the time a wafer as an inspection target is loaded in the apparatus to the time an inspection is completed.

Next, procedures of observing and inspecting the sample with the apparatus of the embodiment will be described using FIG. 11. FIG. 11 is a flowchart from the time the wafer as an inspection target is loaded in the apparatus to the time the inspection is completed. When producing a recipe, an operator determines the optimum conditions on the basis of the procedures. The recipe means data of electron optical conditions and information of the wafer as an inspection target necessary to carry out the inspection, and inspection results, and is stored in the storage device 120.

Figure 12:
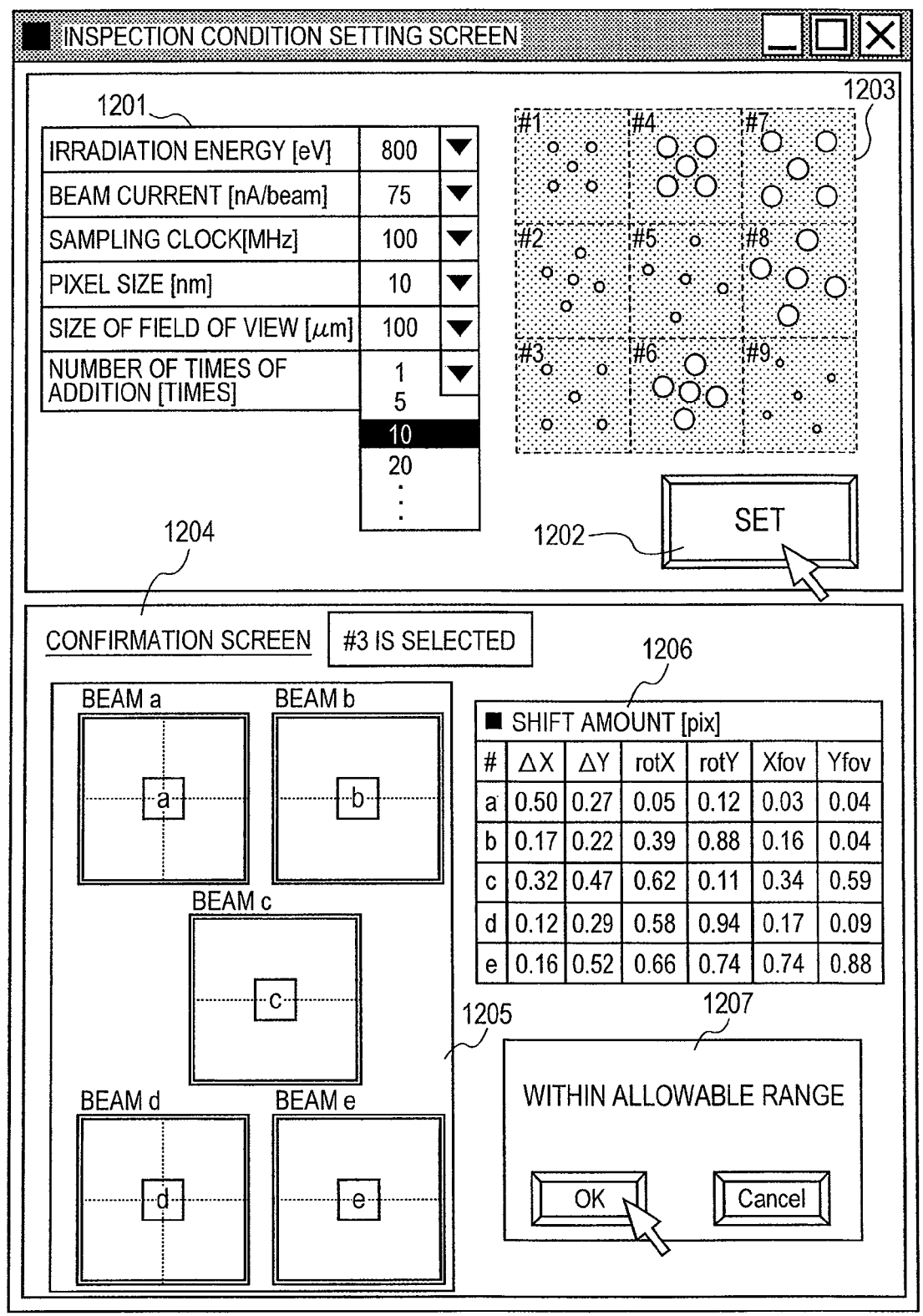
FIG. 12 is a diagram for showing an example of an inspection condition setting screen configuring an inspection condition setting section.

The operator starts the inspection through the input/output unit 124 having the image display device, and loads the wafer as an inspection target in accordance with an instruction of the image display device (Step 1101 in FIG. 11). When the loading is completed, an inspection condition setting screen configuring an inspection condition setting section 1201 an example of which is shown in FIG. 12 is displayed on the image display device. Hereinafter, FIG. 12 is referred to unless otherwise specified. The operator selects and sets the amount of irradiation current, the incident energy, and the other conditions along with the inspection from the pull-down menu of the inspection condition setting section 120 (Step 1102). In the embodiment, a sampling clock (signal obtaining speed per one pixel), a pixel size, the size of field of view, and the number of times of addition are shown as the other conditions. If a set button 1202 is pressed after completing the settings of the all items, the optimum aperture for the set conditions is determined from an aperture pattern display section 1203, and the number of the determined aperture pattern is displayed on a confirmation screen 1204 (Step 1103).

If the aperture pattern is determined and the position of the multibeam is controlled as described above, the stage 115 is moved to a position where a mark that is provided in advance for adjustment can be observed to perform an observation by the multibeam, and SEM images are displayed on an observation result screen 1205 in the confirmation screen 1204. The operation unit 121 measures a shift from the ideal in the SEM images by the multibeam on the basis of the SEM images displayed on the observation result screen 1205, and displays the value at a shift amount display section 1206 in the confirmation screen 1204 (Step 1112). The operation unit 121 determines whether or not the measured shift amount is within an allowable range to display the result in an allowable range confirmation box 1207, and completes the settings of the inspection conditions by selecting OK (Step 1104). In the embodiment, a shift from the X-Y central coordinate, a shift in the rotation direction in each of X and Y directions, and a shift from the ideal size of the field of view are measured as the shift amount, and the allowable range of the shift from the ideal value is set at one pixel or smaller. It should be noted that in the case where Cancel is selected on the confirmation screen 1204, the inspection condition setting section 1201 may be reset or a desired aperture pattern may be manually selected from the aperture patterns 1203. The set inspection conditions are stored in the storage device 120 of the system control unit 123. When the inspection is carried out, control signals are transmitted to various control circuits from the system control unit 123 on the basis of the stored inspection conditions.

After the determination of the irradiation conditions, the operator performs preparations for the inspection such as settings of the amount of focal point correction and layout, alignment, settings of an inspection area, and calibration (Step 1105). It should be noted that the amount of focal point correction is set to correct changes of the focal point caused by changes of the height of the stage during the inspection and changes of the charged amount due to irradiation of electron beams while controlling the lens, the aligner, and the like. The layout is used for an inspection chip and coordinate management of cell arrangement in the chip in accordance with the pattern array in the wafer as an inspection target. The alignment means a process of correcting a minute arrangement shift occurring when the wafer is mounted on the wafer holder. In order to adjust the brightness and contrast of an image at the time of the inspection, the calibration is performed in such a manner that an image is obtained, and gain adjustment and brightness correction are carried out in accordance with the amount of signals depending on the distribution of the brightness. The set parameters are similarly stored in the storage device 120. When the inspection is carried out, the stored parameters are transmitted to the optical system control circuit 127 and the like as control signals from the system control unit 123.

If the preparations for the inspection are completed, image processing conditions to detect defects are set to obtain an image, and a threshold value by which defects are determined is set (Step 1106). An image of a section determined as defects on the basis of the input threshold value in the obtained image is displayed on the image display device, and the threshold value is adjusted to an appropriate value after confirming whether or not the defects have been actually or wrongly detected. The entry of the threshold value, the execution of the image processing, the confirmation of the status of the detection or wrong detection of defects, and the re-entry of the threshold value are repeated, and the optimum inspection conditions are determined. The set of operations (Step 1107) is referred to as a test inspection. It should be noted that the image processing operation is carried out by the operation unit 121. As the threshold value, a combination of threshold values of plural items is used in some cases, and defects are determined by the defect determination unit 122. Any case can be realized by executing a program of the central processing unit as a processing unit. The set parameters are stored in the storage device 120.

If it is determined that the defects are correctly detected and there is no wrong detection in Step 1108 of FIG. 11, the all conditions necessary for the inspection are completely determined. The determination in Step 1108 of FIG. 11 may be manually made by the operator or may be automatically made by setting determination conditions in advance.

A selection screen to select whether to continue the inspection is displayed on the image display device, and thus the operator determines as necessary (Step 1109). If "YES" is selected using a keyboard or a mouse in Step 1109 of FIG. 11, the all conditions set before Step 1109 are read from the storage device 120, and signals are transmitted to various control units from the system control unit 123 to perform the inspection (Step 1110). The inspection result is stored as a recipe file together with the above conditions (Step 1111), and the inspection is completed. It should be noted that in the case where "NO" is selected in Step 1109, the recipe file without the inspection result is stored.

It is obvious that the inspection condition setting screen configuring the inspection condition setting section an example of which is shown in FIG. 12 is not limited to this example, but various modifications are available.

Third Embodiment

In the second embodiment, the aperture pattern set is switched to another by moving the position of the aperture pattern set using the movable stage 307 without moving the primary beams 103. In the embodiment, the aperture pattern set is switched to another by moving the position of the beam splitting electrode 302 where the primary beams 103 are irradiated using electromagnetic deflection without moving the position of the aperture pattern set.

Figure 5:
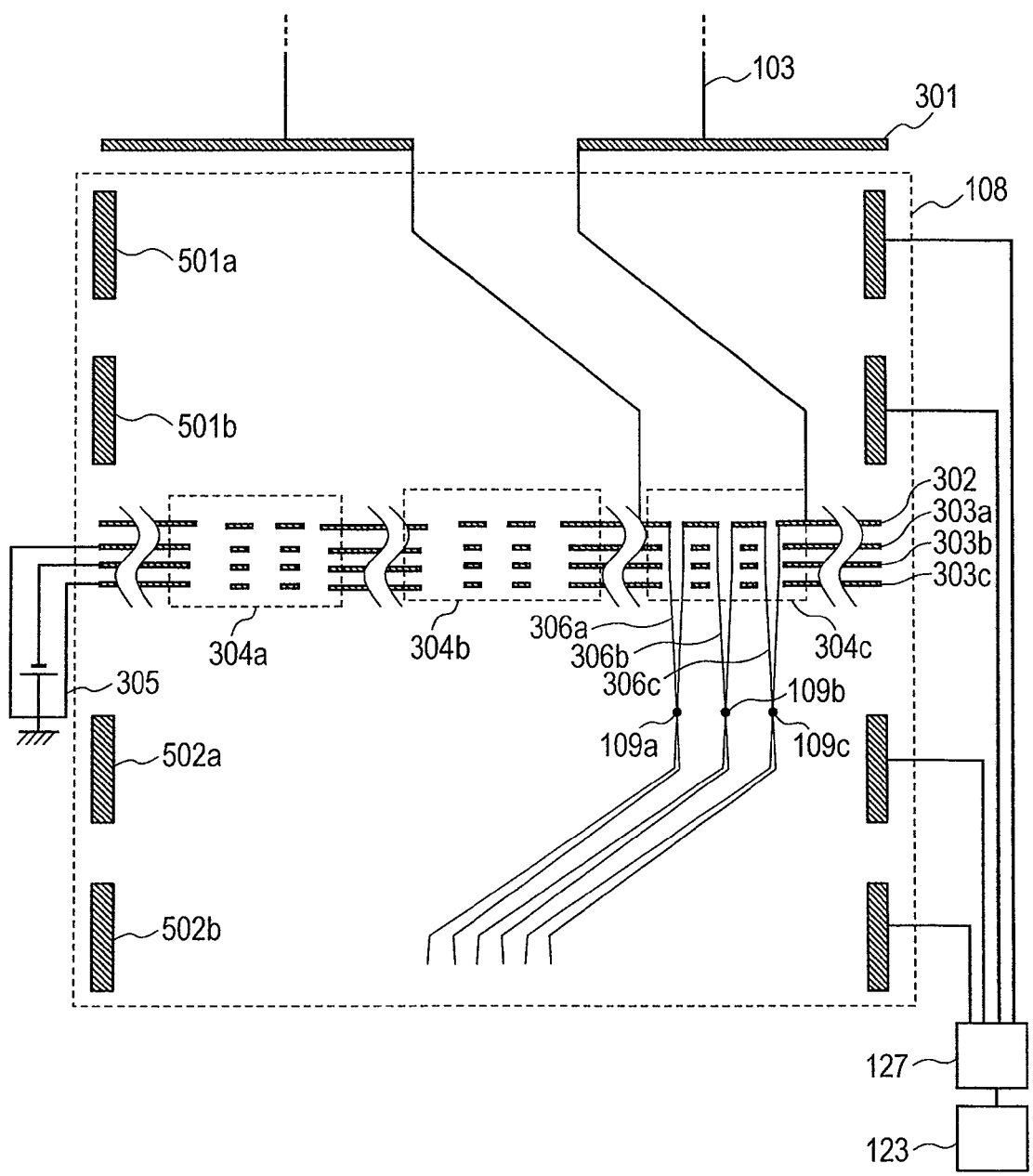
FIG. 5 is a schematic view of a beam-forming section in an electron beam inspection apparatus according to a third embodiment.

FIG. 5 is a schematic view of the beam-forming section 108 in an electron beam inspection apparatus according to the third embodiment. The method of forming the primary beam 103 into the multibeam in the beam-forming section 108 and the aperture patterns of the beam splitting electrode 302 are the same as those in the second embodiment, and thus the explanations thereof will be omitted. In the embodiment, the beam-forming section 108 is configured using upstream deflectors 501*a* and 501*b*, the beam splitting electrode 302, the lens array upper electrode 303*a*, the lens array middle electrode 303*b*, the lens array lower electrode 303*c*, and downstream deflectors 502*a* and 502*b*, and the diaphragm 301 is arranged on the upstream side of the beam-forming section 108. The diaphragm 301, the beam splitting electrode 302, the aperture lens array upper electrode 303*a*, the lens array middle electrode 303*b*, and the lens array lower electrode 303*c* are the same as those in the second embodiment, and thus refer to the explanations thereof. In addition, the upstream deflectors 501*a* and 501*b* and the downstream deflectors 502*a* and 502*b* are connected to the system control unit 123 through the optical system control circuit 127, and are controlled by the system control unit 123.

The upstream deflectors 501*a* and 501*b* and the downstream deflectors 502*a* and 502*b* are used to shift the primary beam 103. The deflection directions of the upper deflector 501*a* and the lower deflector 501*b* of the two upstream deflectors are oppositely set to put back the primary beam 103 with the same intensity, so that the beam can be shifted only by a difference between upper and lower deflection support positions to select the aperture pattern. In a state where the deflectors 501*a* and 501*b* are turned off, the aperture pattern set 304*b* is selected. In the state shown in FIG. 5, the aperture pattern set 304*c* is selected. After the aperture pattern set is selected, the beam is returned onto the optical axis again using the downstream deflectors 502*a* and 502*b*. The deflection directions of the upper deflector 502*a* and the lower deflector 502*b* of the two downstream deflectors are oppositely set to put back the beam with the same intensity, so that the beam can be shifted as similar to the upstream deflectors. This is performed to suppress the aberration of the optical system on the downstream side of the beam-forming section, namely, the aberration of the objective lens in the embodiment in consideration of the fact that the aberration generated by a lens near the axis can be suppressed. Namely, the upstream deflectors 501*a* and 501*b* and the downstream deflectors 502*a* and 502*b* function as a part of the beam current control unit and the beam arrangement control unit in the embodiment.

According to the embodiment as described above, plural aperture sets can be selected if the beam shift by electric deflectors is used without moving the aperture pattern set itself. It should be noted that the procedures of observing and inspecting the sample with the apparatus of the embodiment are the same as those explained using FIG. 11 in the second embodiment, and the explanations thereof will be omitted.

Fourth Embodiment

The second embodiment shows an example in which the selection of the aperture pattern in the beam-forming section 108 is mechanically made by moving the movable stage 307. The third embodiment shows an example in which the selection of the aperture pattern in the beam-forming section 108 is electrically made by the upstream deflectors 501*a* and 501*b* and the downstream deflectors 502*a* and 502*b*. The mechanical control is advantageous in the case where the moving distance is long. However, fine adjustment is difficult. On the contrary, fine adjustment by electric control with the deflectors is relatively easy, but a long-distance beam shift is difficult. Accordingly, the fourth embodiment describes an example in which the mutual disadvantages are compensated by combining coarse adjustment by a mechanical method and fine adjustment by an electric method.

Figure 6:
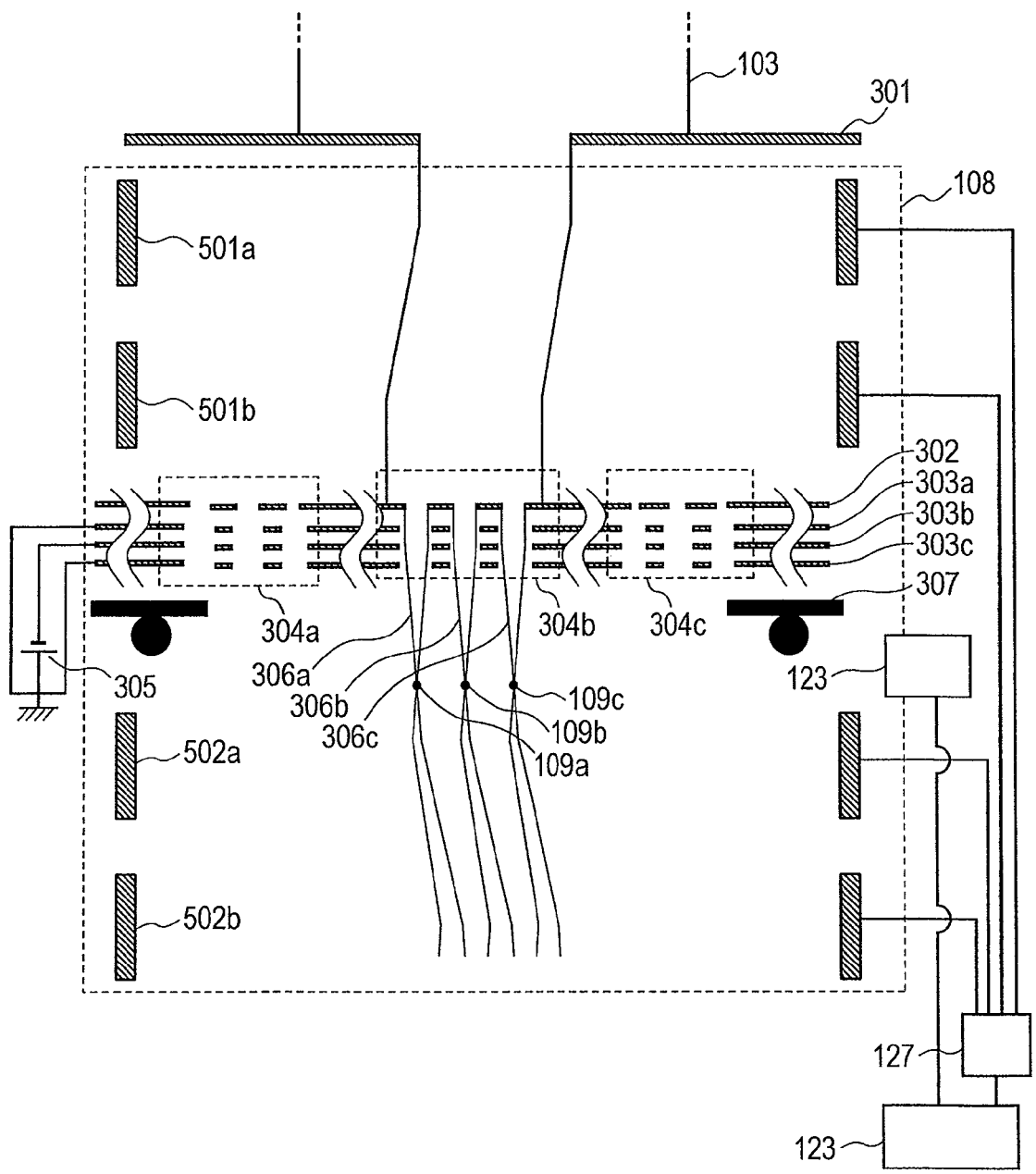
FIG. 6 is a schematic view of a beam-forming section in an electron beam inspection apparatus according to a fourth embodiment.

FIG. 6 is a schematic view of the beam-forming section 108 in an electron beam inspection apparatus according to the fourth embodiment. In the embodiment, the beam-forming section 108 is configured using the upstream deflectors 501*a* and 501*b*, the beam splitting electrode 302, the lens array upper electrode 303*a*, the lens array middle electrode 303*b*, the lens array lower electrode 303*c*, the movable stage 307, and the downstream deflectors 502*a* and 502*b*, and the diaphragm 301 is arranged on the upstream side of the beam-forming section 108. Regarding the diaphragm 301, the beam splitting electrode 302, the aperture lens array upper electrode 303*a*, the lens array middle electrode 303*b*, and the lens array lower electrode 303*c*, refer to the explanations in the second embodiment. Further, the movable stage 307 is connected to the stage control device 308, and the upstream deflectors 501*a* and 501*b* and the downstream deflectors 502*a* and 502*b* are connected to the optical system control circuit 127. The stage control device 308 and the optical system control circuit 127 are connected to the system control unit 123, and are controlled by the system control unit 123. Regarding the details of the movable stage and the deflectors, refer to the second and third embodiments.

In order to select a desired aperture pattern set, the movable stage 307 is controlled to move the desired aperture pattern set to a position where the desired aperture pattern set is selected by the diaphragm 301. In the embodiment, the aperture pattern set 304*b* is selected. Here, even if the aperture pattern set is moved by moving the movable stage 307, fine adjustment of the position of the stage is necessary to exactly place the pattern set at a position where the pattern set is selected by the diaphragm 301. FIG. 6 shows a case in which after coarse adjustment of the position is performed by the movable stage 307, the aperture pattern set 304*b* is selected by fine adjustment performed by the upstream deflectors 501*a* and 501*b*. As similar to the third embodiment, the beam is returned onto the optical axis again by the downstream deflectors 502*a* and 502*b*. In the third embodiment, it is necessary to shift the beam by a long distance of one pattern to select a different pattern set, disadvantageously resulting in distortion and aberration. However, coarse adjustment is performed by moving the movable stage 307 in the embodiment, and thus the amount of electric deflection can be reduced to solve the problem.

It should be noted that the procedures of observing and inspecting the sample with the apparatus of the embodiment are the same as those explained using FIG. 11 in the second embodiment.

Fifth Embodiment

In the second to fourth embodiments, the amount of rotation of the multibeam is controlled by providing the rotation angles corresponding to the amounts of rotation to be selected into the plural aperture patterns as shown in FIG. 4. However, this method cannot adapt to an angle other than the provided rotation angles, and the number of selectable amounts of rotation is restricted. Accordingly, in addition to the example of providing the rotation angles of the plural aperture patterns, an example of further installing a rotation control mechanism is shown in the fifth embodiment.

Figure 7:
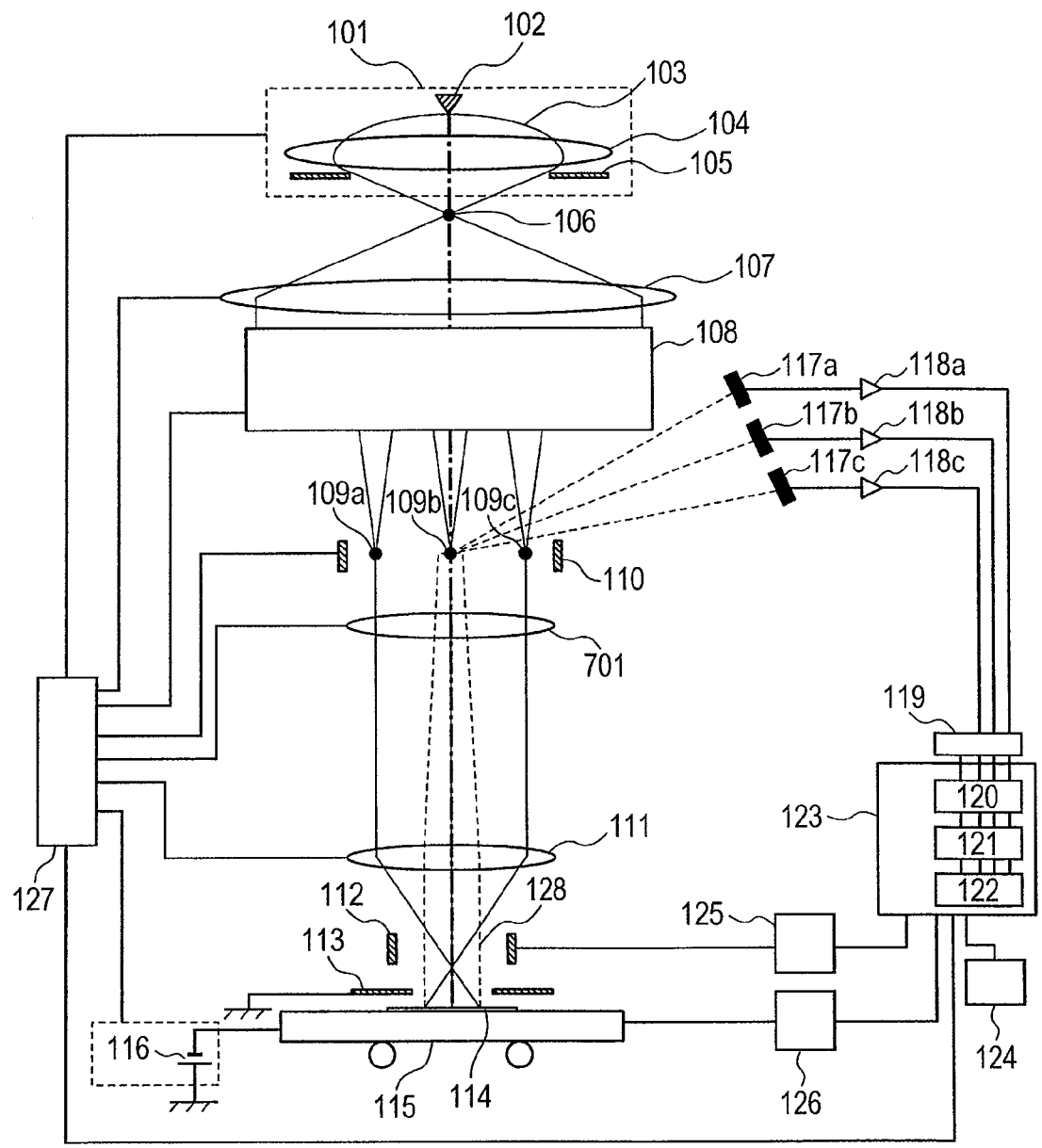
FIG. 7 is a diagram for showing an outline configuration of an electron beam inspection apparatus according to a fifth embodiment.

FIG. 7 is a diagram for showing an outline configuration of an electron beam inspection apparatus according to the fifth embodiment. Most configurations are the same as the basic configurations of the first embodiment, and the fifth embodiment is different from the first embodiment in that an electromagnetic lens 701 is inserted between the beam-forming section 108 and the beam separator 110. Regarding the same content as the basic configurations of the first embodiment, refer to the explanations of the first embodiment. In addition, the beam-forming section 108 in FIG. 7 corresponds to any one of the configurations shown in FIGS. 3A, 3B, 5, and 6. Regarding these configurations, refer to the second, third and fourth embodiments.

The electromagnetic lens 701 is an electromagnetic lens that is large in the rotation effect as compared to the converging effect of a beam. This can be realized by providing sufficiently-wide magnetic field distribution in the direction along the optical axis. Accordingly, the electromagnetic lens 701 can change the amount of rotation of the multibeam while hardly changing the magnification of the optical system. Specifically, the amount of rotation of the multibeam can be freely controlled by setting the rotation angle by selection of the aperture pattern and by changing the rotation lens effect by the electromagnetic lens 701.

It should be noted that the electromagnetic lens 701 is located between the beam separator 110 and the objective lens 111 in the embodiment. Even in the case where the electromagnetic lens 701 is arranged at a different position, the effect of the invention is not lost.

It should be noted that the procedures of observing and inspecting the sample with the apparatus of the embodiment are the same as those explained using FIG. 11 in the second embodiment.

Sixth Embodiment

In the second to fifth embodiments, plural aperture patterns with different rotation angles of aperture patterns, different aperture pitches, and different aperture diameters are provided in the beam-forming section 108, and the control is performed by selecting one matching the desired conditions. In the embodiment, patterns with different rotation angles are not formed, but only the aperture diameters and the aperture pitches are changed to form the aperture patterns, so that an inspection apparatus that can control the incident energy, the irradiation current, and the multibeam arrangement can be provided.

Figure 10:
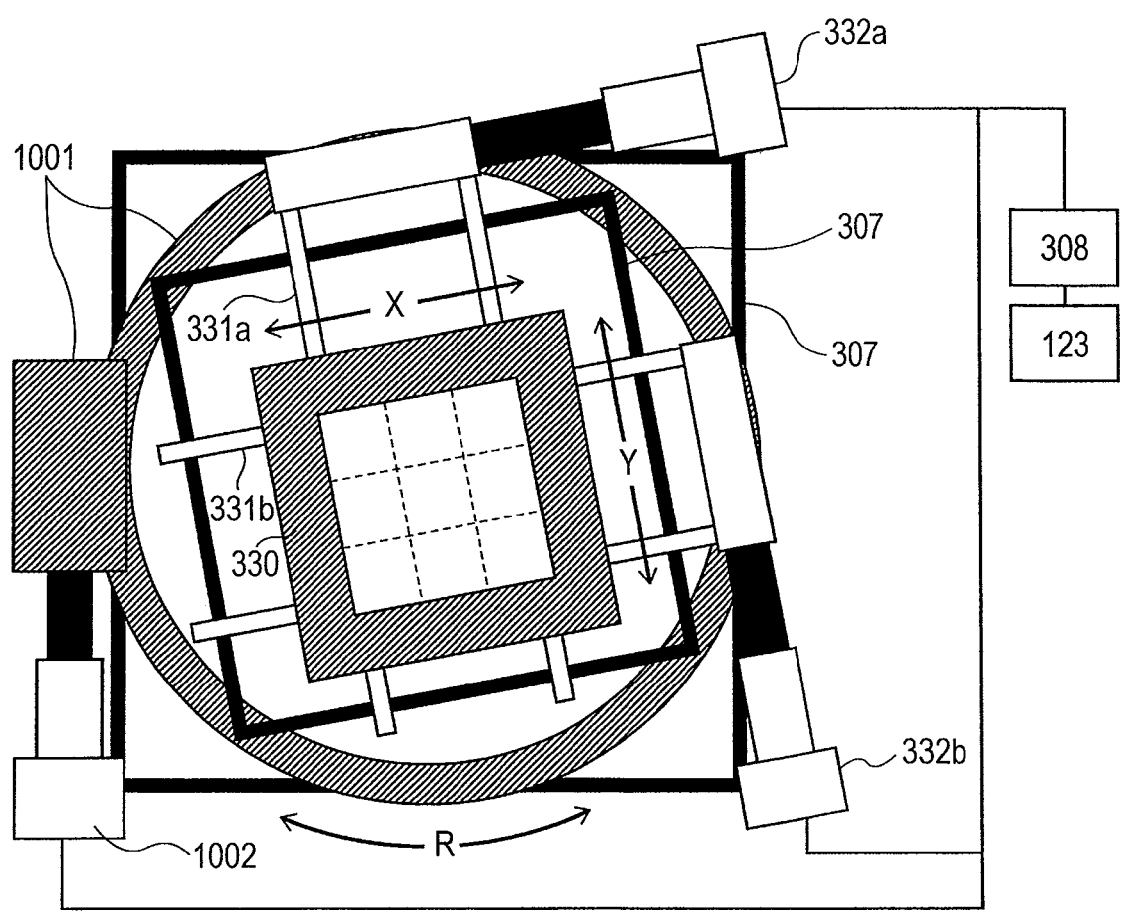
FIG. 10 is a schematic view of the beam-forming section in the electron beam inspection apparatus according to the seventh embodiment when viewed from the upper side.

An outline of a configuration of the apparatus according to the sixth embodiment corresponds to any one shown in FIG. 1 or FIG. 7, and an outline of the beam-forming section 108 is shown in FIG. 3A, 3B or FIG. 6. FIG. 10 is a diagram of the beam-forming section 108 when viewed from the upper side in the embodiment. FIG. 10 is the same as FIG. 3B except the arrangement of a rotation mechanism 1001 between the stage 307 and the XY movable mechanism, namely, the X-direction rail 331a and the Y-direction rail 331b. The rotation mechanism 1001 is driven by a rotation direction motor 1002 in the rotation directions (represented by R in FIG. 10), and an object mounted thereon can be rotated by an arbitrary angle.

Since the XY movable mechanisms 331a and 331b are located above the rotation mechanism 1001, the angle can be controlled by the rotation mechanism in a state where an arbitrary aperture pattern is selected by the XY movable mechanisms. It should be noted that an aperture is provided in the middle of the rotation mechanism 1001 to allow the electron beam to pass through the electrodes 330. The rotation direction motor 1002, the X-direction motor 332a, and the Y-direction motor 332b are connected to the stage control device 308, and the electrodes 330 can be rotated only by a desired angle and can be moved to a desired position by a signal transmitted by the stage control device 308. It should be noted that when the electron beam is allowed to pass through, voltage is applied from the lens power source 305 to the lens middle electrode 303b as described in FIG. 3A or FIG. 6. However, when the stage is moved, the voltage is desirably turned off.

As described above, the movable stage 307 is provided with the rotation function in addition to the moving function in the embodiment. Specifically, the beam-forming section 108 of the sixth embodiment is different from those in the second, fourth, and fifth embodiments in that the movable stage 307 is provided with the rotation function. Regarding the same content, refer to the second, fourth, and fifth embodiments.

The angle of the aperture pattern can be freely changed by rotation of the movable stage 307 in the embodiment. Accordingly, the amount of rotation of the multibeam can be controlled without providing the change of the angle in the aperture pattern in the embodiment. As a result, the types of aperture diameters and aperture intervals of the aperture pattern can be increased.

Figure 8:
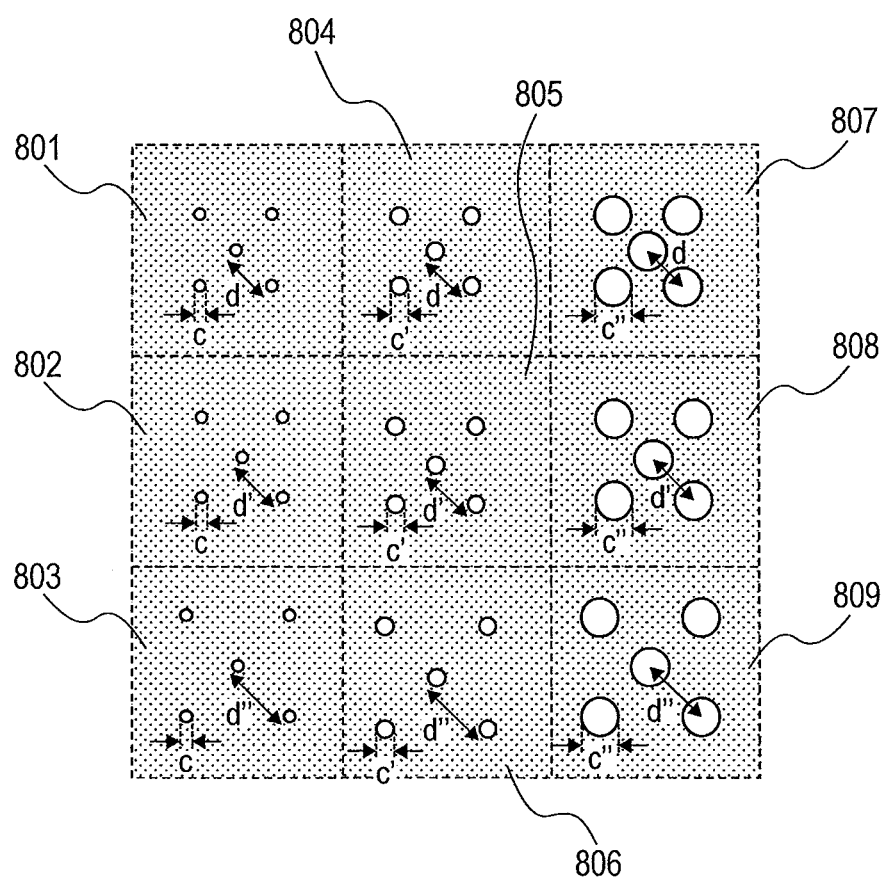
FIG. 8 is a schematic view of a beam splitting electrode according to a sixth embodiment.

FIG. 8 is a schematic view of the beam splitting electrode 302 of the embodiment when viewed from the upper side of FIG. 3A or FIG. 6. It should be noted that the aperture patterns of the lens array upper electrode 303a, the lens array middle electrode 303b, and the lens array lower electrode 303c are the same as those in the second embodiment. In addition, nine types of aperture pattern sets are prepared in the embodiment. However, the effect of the invention is not lost irrespective of the number of aperture pattern sets. In FIG. 8, nine types of aperture patterns 801 to 809 with different aperture diameters and aperture intervals are shown. The aperture diameter of each of the aperture patterns 801, 802, and 803 is c, whereas that of each of the aperture patterns 804, 805, and 806 is c' and that of each of the aperture patterns 807, 808, and 809 is c". Further, the aperture interval of each of the aperture patterns 801, 804, and 807 is d, whereas that of each of the aperture patterns 802, 805, and 808 is d' and that of each of the aperture patterns 803, 806, and 809 is d". The plural aperture patterns having apertures with intervals that are different from each other are prepared. When compared to FIG. 4, it can be understood that the types of aperture diameters and aperture intervals can be increased, and the incident energy, the irradiation current, and the multibeam arrangement can be more finely controlled.

It should be noted that the number of apertures of the all aperture patterns is five in the embodiment, and the primary beam is split into five. However, it is obvious that the embodiment is not limited to this. As described above, the magnification of the multibeam arrangement can be changed and the current value can be controlled by selecting the aperture pattern, and the rotation of the multibeam arrangement can be realized by the rotation mechanism 1001. It should be noted that regarding changes of the magnification and the aperture diameters, the configurations of representative nine types of aperture patterns are exemplified in the embodiment. However, the effect of the present invention is not lost in other cases. It should be noted that the procedures of observing and inspecting the sample with the apparatus of the embodiment are the same as those in the second embodiment, and the explanations thereof will be omitted.

Seventh Embodiment

In the sixth embodiment, the movable stage 307 is provided with the rotation mechanism, so that the amount of rotation of the multibeam is controlled not by the angle of each aperture pattern of the beam splitting electrode 302 but by the movable stage 307. In the embodiment, an example of an apparatus in which the magnification of the optical system is controlled by changes of the magnification using a zoom lens, and the control can be easily performed even if the number of types of provided aperture patterns is small is further shown.

Figure 9:
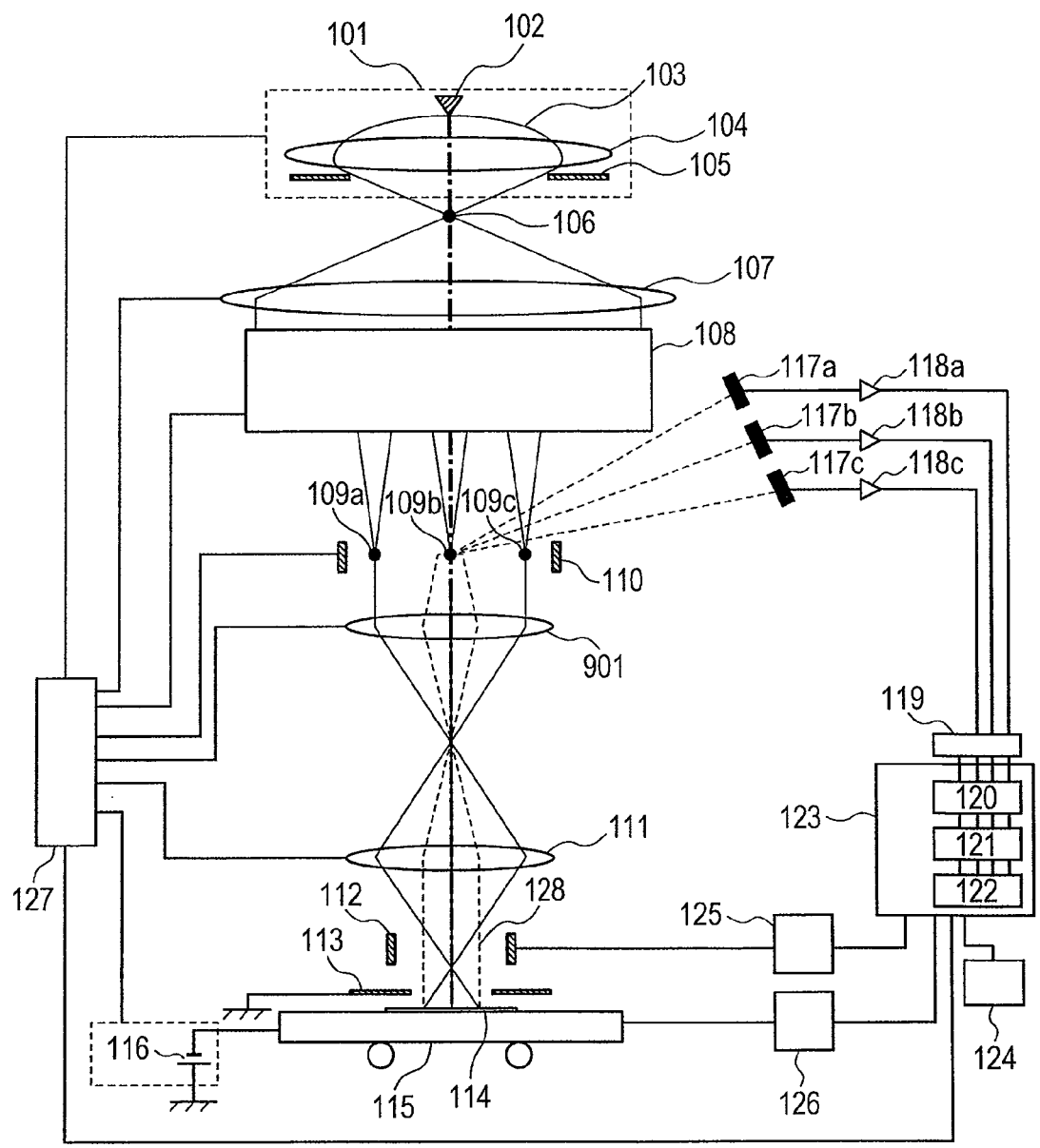
FIG. 9 is a diagram for showing an outline configuration of an electron beam inspection apparatus according to a seventh embodiment.

FIG. 9 is a diagram for showing an outline configuration of an electron beam inspection apparatus according to the seventh embodiment. Most configurations are the same as those of the first embodiment, and the seventh embodiment is different from the first embodiment in that an electromagnetic lens 901 is inserted between the beam-forming section 108 and the beam separator 110. Regarding the same content, refer to the first embodiment. In addition, the beam-forming section 108 in FIG. 9 corresponds to any one of the configurations shown in FIGS. 3 and 6. Regarding these configurations, refer to the second and fourth embodiments. The electromagnetic lens 901 functions as a zoom lens by being combined with the objective lens 111. Accordingly, the magnification of the optical system can be changed. Specifically, the intervals of the beams can be controlled by the electromagnetic lens 901.

Further, a movable stage 802 is provided with the rotation function in the embodiment, so that the amount of rotation of the multibeam can be controlled and only an aperture diameter is used as a control parameter. Thus, the amount of rotation and the intervals of the multibeam can be controlled without providing changes of the angles and aperture intervals in the aperture patterns in the embodiment. As a result, the types of aperture diameters of the aperture patterns can be increased.

Further, although not shown in the drawing, the amount of rotation of the multibeam may be adjusted using the rotation lens 701 as shown in the fifth embodiment. It should be noted that the procedures of observing and inspecting the sample with the apparatus of the embodiment are the same as those in the second embodiment, and the explanations thereof will be omitted.

DESCRIPTION OF REFERENCE NUMERALS

101 . . . electron gun, 102 . . . electron source, 103 . . . primary beam, 104 . . . electromagnetic lens, 105 . . . anode, 106 . . . first electron source image, 107 . . . lens, 108 . . . beam-forming section, 109a . . . second electron source image, 109b . . . second electron source image, 109c . . . second electron source image, 110 . . . beam separator, 111 . . . objective lens, 112 . . . scanning deflecting deflector, 113 . . . ground electrode, 114 . . . wafer, 115 . . . stage, 116 . . . retarding power source, 117a . . . secondary beam detector, 117b . . . secondary beam detector, 117c . . . secondary beam detector, 118a . . . amplifying circuit, 118b . . . amplifying circuit, 118c . . . amplifying circuit, 119 . . . A/D converter, 120 . . . storage device, 121 . . . operation unit, 122 . . . defect determination unit, 123 . . . system control unit, 124 . . . input/output unit with image display device, 125 . . . scanning signal generating device, 126 . . . stage control device, 127 . . . optical system control circuit, 128 . . . secondary beam, 200a . . . primary beam, 200b . . . primary beam, 200c . . . primary beam, 200d . . . primary beam, 200e . . . primary beam, 201a . . . deflection width, 201b . . . deflection width, 201c . . . deflection width, 201d . . . deflection width, 201e . . . deflection width, 202a . . . primary beam interval projected in direction orthogonal to travelling direction of stage, 202b . . . primary beam interval projected in direction orthogonal to travelling direction of stage, 202c . . . primary beam interval projected in direction orthogonal to travelling direction of stage, 202d . . . primary beam interval projected indirection orthogonal to travelling direction of stage, 203 . . . width of field of view, 204 . . . area where primary beams are irradiated doubly, 205 . . . area where no primary beams are irradiated, 301 . . . diaphragm, 302 . . . beam splitting electrode, 303a . . . lens array upper electrode, 303b . . . lens array middle electrode, 303c . . . lens array lower electrode, 304a . . . aperture pattern set, 304b . . . aperture pattern set, 304c . . . aperture pattern set, 305 . . . lens power source, 306a . . . split primary beam, 306b . . . split primary beam, 306c . . . split primary beam, 307 . . . movable stage, 308 . . . stage control device, 330 . . . electrode, 331a . . . X-direction rail, 331b . . . Y-direction rail, 332a . . . X-direction motor, 332b . . . Y-direction motor, 401 . . . aperture pattern, 402 . . . aperture pattern, 403 . . . aperture pattern, 404 . . . aperture pattern, 405 . . . aperture pattern, 406 . . . aperture pattern, 407 . . . aperture pattern, 408 . . . aperture pattern, 409 . . . aperture pattern, 501a . . . upstream deflector, 501b . . . upstream deflector, 502a . . . downstream deflector, 502b . . . downstream deflector, 701 . . . electromagnetic lens, 801 . . . aperture pattern, 802 . . . aperture pattern, 803 . . . aperture pattern, 804 . . . aperture pattern, 805 . . . aperture pattern, 806 . . . aperture pattern, 807 . . . aperture pattern, 808 . . . aperture pattern, 809 . . . aperture pattern, 901 . . . electromagnetic lens, 1001 . . . rotation mechanism, 1002 . . . rotation direction motor, 1101 . . . wafer load step, 1102 . . . inspection condition setting step, 1103 . . . aperture pattern selection step, 1104 . . . aperture pattern confirmation step, 1105 . . . inspection preparation step, 1106 . . . image processing condition/threshold value setting step, 1107 . . . test inspection step, 1108 . . . wrong detection confirmation step, 1109 . . . inspection continuation confirmation step, 1110 . . . inspection execution step, 1111 . . . recipe storage step, 1112 . . . beam arrangement measurement step, 1201 . . . inspection condition setting section, 1202 . . . set button, 1203 . . . aperture pattern display section, 1204 . . . confirmation screen, 1205 . . . observation result screen, 1206 . . . shift amount display section, 1207 . . . allowable range confirmation box

The invention claimed is:

1. A charged particle beam applied apparatus that observes a sample, the apparatus comprising:
a beam-forming section that forms plural charged particle beams on the sample and includes plural aperture patterns having apertures with intervals that are different from each other; an energy control unit that controls the incident energy of the plural charged particle beams irradiated onto the sample;

a beam current control unit that controls the beam current of the plural charged particle beams irradiated onto the sample, and wherein the beam-forming section is configured using a beam splitting electrode having the plural aperture patterns, a lens array composed of at least three electrodes having the plural aperture patterns, and a movable stage on which the beam splitting electrode and lens array are mounted.

2. The charged particle beam applied apparatus according to claim 1, wherein each of the plural aperture patterns includes at least three apertures arranged at the same aperture interval.

3. The charged particle beam applied apparatus according to claim 1, wherein an interval between an arbitrary first aperture pattern and an arbitrary second aperture pattern included in the plural aperture patterns is twice or longer the aperture interval configuring the first aperture pattern and the aperture interval configuring the second aperture pattern.

4. The charged particle beam applied apparatus according to claim 1, wherein the beam-forming section is configured using a beam splitting electrode having the plural aperture patterns, a lens array composed of at least three electrodes having the plural aperture patterns, an upstream deflector arranged on the upstream side of the beam splitting electrode, and a downstream deflector arranged on the downstream side of the beam splitting electrode, and each of the upstream deflector and the downstream deflector is configured using a combination of at least two deflectors.

5. The charged particle beam applied apparatus according to claim 1, wherein the beam-forming section is configured using a beam splitting electrode having the plural aperture patterns, a lens array composed of at least three electrodes having the plural aperture patterns, a movable stage on which the beam splitting electrode and the lens array are mounted, an upstream deflector arranged on the upstream side of the beam splitting electrode, and a downstream deflector arranged on the downstream side of the beam splitting electrode, and each of the upstream deflector and the downstream deflector is configured using a combination of at least two deflectors.

6. The charged particle beam applied apparatus according to claim 1, wherein at least two electromagnetic lenses are provided on the downstream side of the beam-forming section, and at least one of the electromagnetic lenses rotates the charged particle beam.

7. The charged particle beam applied apparatus according to claim 1, wherein the movable stage allows the beam splitting electrode and the lens array to move in the rotation direction as well as in parallel.

8. The charged particle beam applied apparatus according to claim 7, wherein at least two electromagnetic lenses are provided on the downstream side of the beam-forming section, and the magnification can be controlled by a combination of excitations of at least the two electromagnetic lenses while maintaining the conditions of connecting the focal point on the sample.

9. A charged particle beam applied apparatus that observes a sample, the apparatus comprising:

a beam-forming section that forms plural charged particle beams on the sample and includes plural aperture patterns having apertures with intervals that are different from each other, and a control unit that controls the incident energy and the beam current of the plural charged particle beams irradiated onto the sample, and the arrangement irradiated onto the sample;

wherein the beam-forming section is configured using a beam splitting electrode having the plural aperture patterns, a lens array composed of at least three electrodes having the plural aperture patterns, and a movable stage on which the beam splitting electrode and the lens array are mounted, and the control unit controls the beam current of the plural charged particle beams and the arrangement irradiated onto the sample by moving the movable stage.

10. The charged particle beam applied apparatus according to claim 9, wherein the beam-forming section is configured using a beam splitting electrode having the plural aperture patterns, a lens array composed of at least three electrodes having the plural aperture patterns, an upstream deflector arranged on the upstream side of the beam splitting electrode, and a downstream deflector arranged on the downstream side of the beam splitting electrode;

each of the upstream deflector and the downstream deflector is configured using a combination of at least two deflectors, and the control unit controls the beam current of the plural charged particle beams and the arrangement irradiated onto the sample by controlling the upstream deflector and the downstream deflector.

11. An irradiation method for charged particle beams of a charged particle beam applied apparatus that observes a sample, wherein a beam-forming section that forms plural charged particle beams on the sample and includes plural aperture patterns having apertures with intervals that are different from each other, and a control unit that controls the apparatus are provided, the beam-forming section is configured using a lens array composed of at least three electrodes having plural aperture patterns, and the control unit controls the incident energy of the plural charged particle beams irradiated onto the sample, controls the beam current of the plural charged particle beams irradiated onto the sample, and controls the arrangement of the plural charged particle beams irradiated onto the sample;

wherein the control unit controls the beam current of the plural charged particle beams irradiated onto the sample, and the arrangement of the plural charged particle beams irradiated onto the sample by selecting any one of the plural aperture patterns of the beam-forming section.

12. The irradiation method for charged particle beams according to claim 11, wherein the control unit controls the plural charged particle beams to rotate around the optical axis of the charged particle beam applied apparatus.

* * * * *